(12) United States Patent
Denda et al.

(10) Patent No.: US 8,952,408 B2
(45) Date of Patent: Feb. 10, 2015

(54) LIGHT-EMITTING ELEMENT MOUNTING PACKAGE, LIGHT-EMITTING ELEMENT PACKAGE, AND METHOD OF MANUFACTURING THESE

(71) Applicant: Shinko Electric Industries Co., Ltd., Nagano (JP)

(72) Inventors: Tatsuaki Denda, Nagano (JP); Kazutaka Kobayashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 72 days.

(21) Appl. No.: 13/710,648

(22) Filed: Dec. 11, 2012

(65) Prior Publication Data

US 2013/0153946 A1    Jun. 20, 2013

(30) Foreign Application Priority Data

Dec. 19, 2011    (JP) .................................. 2011-277737
Oct. 29, 2012    (JP) .................................. 2012-238318

(51) Int. Cl.
| | | |
|---|---|---|
| *H01L 33/00* | (2010.01) | |
| *H01L 33/60* | (2010.01) | |
| *H05K 1/02* | (2006.01) | |
| *H01L 21/50* | (2006.01) | |
| *H05K 1/11* | (2006.01) | |

(52) U.S. Cl.
CPC ............. *H01L 33/60* (2013.01); *H05K 1/0265* (2013.01); *H01L 21/50* (2013.01); *H05K 1/0203* (2013.01); *H05K 1/0274* (2013.01); *H05K 1/111* (2013.01); *H05K 2201/098* (2013.01); *H05K 2201/099* (2013.01); *H05K 2201/10106* (2013.01); *H05K 2201/2054* (2013.01); *H05K 2201/09409* (2013.01)

USPC .............................. 257/98; 438/106; 438/127

(58) Field of Classification Search
CPC ........................................................ H01L 33/60
USPC ..................................... 257/98; 438/106–127
See application file for complete search history.

(56) References Cited

U.S. PATENT DOCUMENTS

| | | | |
|---|---|---|---|
| 6,384,472 | B1 | 5/2002 | Huang |
| 7,271,347 | B2 * | 9/2007 | Ohwaki .......................... 174/252 |
| 2003/0072153 | A1 | 4/2003 | Matsui et al. |
| 2008/0106875 | A1 | 5/2008 | Igarashi et al. |
| 2009/0178828 | A1 * | 7/2009 | Tsumura et al. ............... 174/252 |
| 2011/0132644 | A1 | 6/2011 | Nishi et al. |

FOREIGN PATENT DOCUMENTS

| | | |
|---|---|---|
| JP | 2003-092011 | 3/2003 |
| JP | 2006-319074 | 11/2006 |

OTHER PUBLICATIONS

Extended European Search Report dated Oct. 7, 2014 issued with respect to the corresponding European Patent Application No. 12197763.1.

* cited by examiner

*Primary Examiner* — Mohammad Islam
*Assistant Examiner* — Ankush Singal
(74) *Attorney, Agent, or Firm* — IPUSA, PLLC

(57) ABSTRACT

A light-emitting element mounting package includes a light-emitting element mounting portion that includes a plurality of wiring portions arranged interposing a predetermined gap between the wiring portions facing each other, and an insulating layer on which the light-emitting element mounting portion is mounted, wherein an upper surface of the light-emitting element mounting portion is exposed on the insulating layer, wherein cutout portions are formed on lower sides of side edges of the wiring portions and contact the insulating layer.

12 Claims, 41 Drawing Sheets

LIGHT-EMITTING ELEMENT MOUNTING PACKAGE, LIGHT-EMITTING ELEMENT PACKAGE, AND METHOD OF MANUFACTURING THESE

CROSS-REFERENCE TO RELATED APPLICATIONS

This patent application is based upon and claims the benefit of priority of the prior Japanese Patent Application No. 2011-277737 filed on Dec. 19, 2011 and the benefit of priority of the prior Japanese Patent Application No. 2012-238318 filed on Oct. 29, 2012, the entire contents of which are incorporated herein by reference.

FIELD

The present invention relates to a light-emitting element mounting package in which plural light-emitting elements are to be mounted, a light-emitting element package in which plural light-emitting elements are mounted, and a method of manufacturing these.

BACKGROUND

In recent years, light emitting diodes (hereinafter, LEDs) have attracted attention because the LEDs consume less power and have longer operating lives than various other light sources. For example, there is proposed a LED light module on which plural LEDs are mounted. In such a LED light module, wiring portions (pads) on which the LEDs are mounted are thick enough to quickly radiate heat generated by the LEDs, as disclosed in, for example, Japanese Laid-open Patent Publication No. 2003-092011 and Japanese Laid-open Patent Publication No. 2006-319074.

SUMMARY

According to an aspect of the embodiment, there is provided a light-emitting element mounting package that includes a light-emitting element mounting portion that includes a plurality of wiring portions arranged interposing a predetermined gap between the wiring portions facing each other, and an insulating layer on which the light-emitting element mounting portion is mounted, wherein an upper surface of the light-emitting element mounting portion is exposed on the insulating layer, wherein cutout portions are formed on lower sides of side edges of the wiring portions and contact the insulating layer.

The object and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

DESCRIPTION OF EMBODIMENTS

As described previously, the wiring portions on which the LEDs are mounted may be formed by a subtractive method.

When the wiring portions are thicker, gaps between adjacent wiring portions are not made narrower. Therefore, there is a problem that LEDs having terminals at a narrow pitch are not mounted.

Preferred embodiments of the present invention will be described with reference to accompanying drawings.

Where the same reference symbols are attached to the same parts, repeated description of the parts is omitted.

[a] First Embodiment

[Structure of Light-Emitting Element Mounting Package of the First Embodiment]

Figure 1:
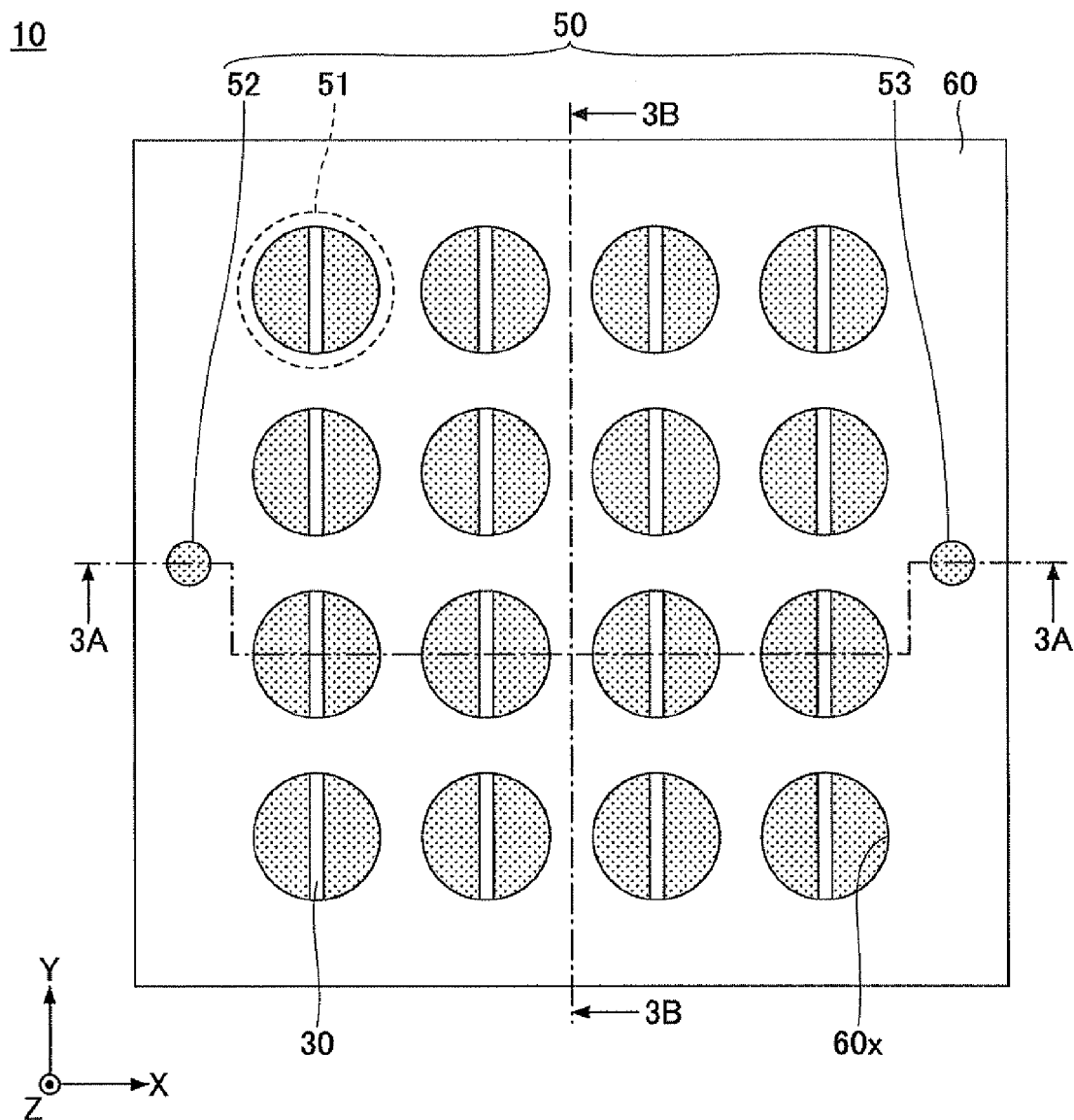
FIG. 1 is a plan view of a light-emitting element mounting package of a first embodiment.
Figure 2:
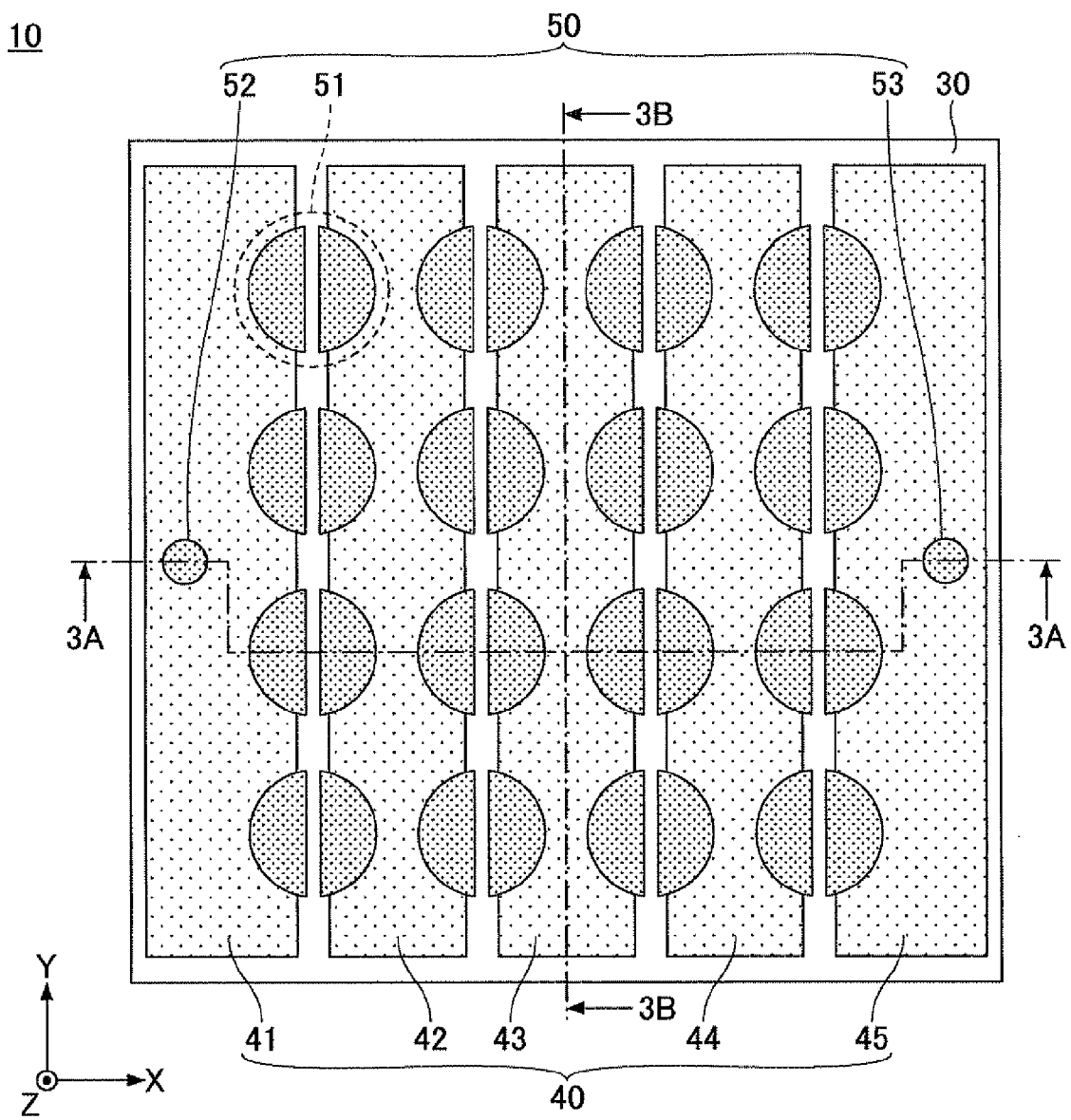
FIG. 2 is another plan view of the light-emitting element mounting package of the first embodiment.
Figure 3A:
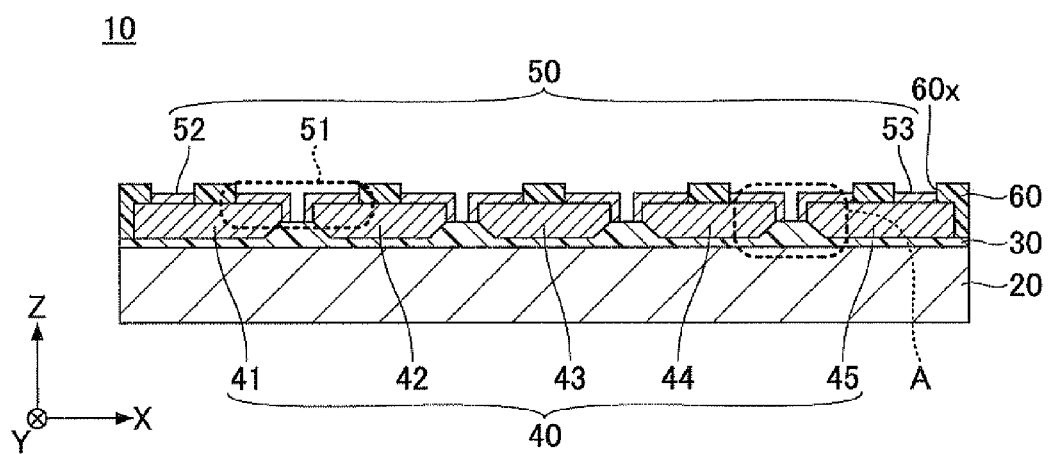
FIG. 3A is a cross-sectional view taken along a line 3A-3A in FIG. 1.
Figure 3B:
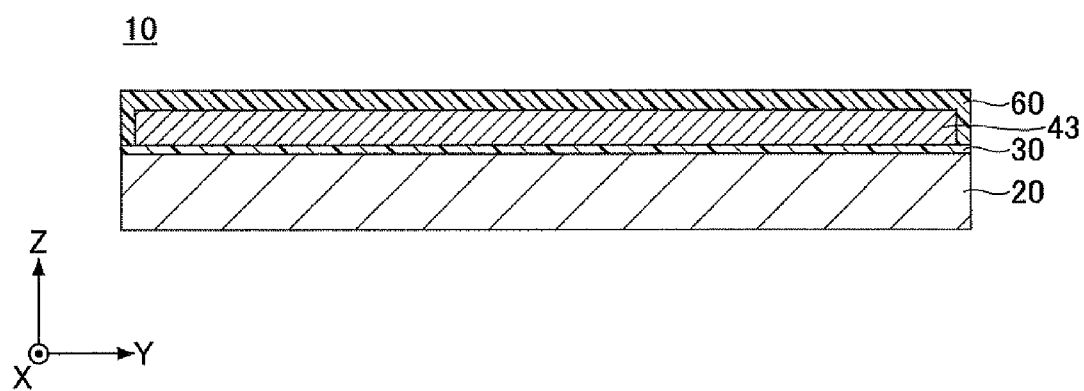
FIG. 3B illustrates a cross-sectional view of the light-emitting element mounting package illustrated in FIG. 3A taken along a line 3B-3B
Figure 4:
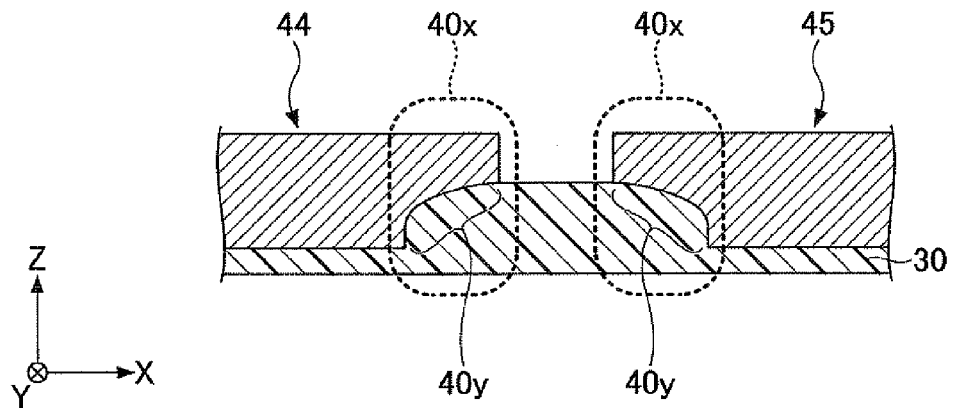
FIG. 4 is an enlarged cross-sectional view illustrating a part A of FIG. 3A.

The structure of a light-emitting element mounting package of the first embodiment is described. FIG. 1 is a plan view of the light-emitting element mounting package of the first embodiment. FIG. 2 is another plan view of the light-emitting element mounting package of the first embodiment. In FIG. 2, a reflective film 60 illustrated in FIG. 1 is omitted. FIG. 3A is a cross-sectional view taken along a line 3A-3A of FIG. 1. FIG. 3B is a cross-sectional view taken along a line 3B-3B of FIG. 1. FIG. 4 is an enlarged cross-sectional view illustrating a part A of FIG. 3A.

For convenience, a plating film 50 illustrated in FIGS. 1 and 2 and a light-emitting element mounting portion 40 are patterned by dots in FIGS. 1 and 2 (may be similar in other figures). Referring to FIG. 4, only the insulating layer 30 and the light-emitting element mounting portion 40 are illustrated.

Referring to FIGS. 1 to 4, the light-emitting element mounting package 10 includes a metallic plate 20, an insulating layer 30, a light-emitting element mounting portion 40, a plating film 50, and a reflective film 60.

The metallic plate 20 functions as a radiator plate for outward transferring heat generated by a light emitting element mounted on the light-emitting element mounting package 10 to outside the light-emitting element mounting package 10. The metallic plate 20 is a base for forming the insulating layer 30 and the light-emitting element mounting portion 40. For example, the material of the metallic plate 20 may be copper (Cu), a copper alloy, aluminum, an aluminum alloy, or the like having good heat conductivity. The thickness of the metallic plate 20 may be, for example, about 100 μm to about 2000 μm.

The insulating layer 30 is formed on the metallic plate 20. The insulating layer 30 insulates the metallic plate 20 from the light-emitting element mounting portion 40. The material of the insulating layer 30 may be, for example, an epoxy insulating resin, polyimide, or another resin. The thickness of the insulating layer 30 is, for example, about 15 μm to about 200 μm.

The light-emitting element mounting portion 40 includes wiring portions 41 to 45, which are electrically insulated from one another. The light-emitting element mounting portion 40 is formed on the insulating layer 30 so that the light-emitting element mounting portion 40 is embedded into the insulating layer 30. However, a part including the upper surface of the light-emitting element mounting portion 40 (the upper surfaces of the wiring portions 41 to 45) is exposed on the insulating layer 30. The material of the light-emitting element mounting portion 40 is a metal such as copper (Cu) and a copper alloy. The thickness of the light-emitting element mounting portion 40 is, for example, about 20 μm to 100 μm.

The wiring portions 41 to 45 are shaped like a rectangle or a ruler in their plan views. The wiring portions 41 to 45 are arranged so that predetermined gaps are interposed between long sides of adjacent wiring portions that face each other, respectively. For example, the lengths of the long sides of the wiring portions 41 to 45 are about 5 mm to 10 mm, the lengths of the short sides of the wiring portions 41 to 45 are about 1 mm to 5 mm, and the gaps between the wiring portions are about 50 μm to 100 μm.

Cutout portions 40y are formed on (under) lower sides (facing the insulating layer 30) in side edge portions provided at the side edges that face each other and belong to adjacent wiring portions 41 to 45 respectively. The parts of the wiring portions 41 to 45 facing the cutout portions 40y are thinner than the other parts of the wiring portions 41 to 45 respectively. The thicknesses of the adjacent wiring portions 41 to 45 in the cutout portions 40y are less than the thicknesses of the adjacent wiring portions 41 to 45 in the parts other than the cutout portions 40y. Referring to FIG. 3A, the cutout portions 40y are not formed on the side edge portions which belong to the wiring portions 41 and 45 and do not face the other wiring portions 42 and 44, respectively. Referring to FIG. 3B, the cutout portions 40y are not formed on outer ends of the wiring portions 41 and 45.

The cutout portions 40y of the wiring layers 41 to 45 are covered by the insulating layer 30. The parts other than the cutout portions 40y of the wiring layers 41 to 45 in the side edge portions 40x protrudes from the insulating layer 30 so as to be positioned higher than the insulating layer 30. The cross-sectional shapes of the cutout portions 40y are, for example, rounded concavities or the like as illustrated in FIG. 4. The upper surfaces of the wiring portions 41 to 45 (i.e., the surfaces on which the cutout portions 40y are not formed) are substantially flat.

In the wiring portions 41 to 45, the cross-sectional shapes of the respective cutout portions 40y belonging to the adjacent wiring portions are line-symmetric with respect to an imaginary line (not illustrated) which passes through the center of the gap between the adjacent wiring portions and extends in the thickness direction of the adjacent wiring portions. Here, the above "line symmetry" means that the cross-sectional shapes of the respective cutout portions 40y belonging to the adjacent wiring portions are substantially line-symmetric with respect to the imaginary line, and does not mean exact line symmetry. Therefore, even if the cross-sectional shapes of the respective cutout portions 40y belonging to the adjacent wiring portions are out of the exact line symmetry, such a situation may be called the "line symmetry" as long as predetermined effects of the first embodiment are achieved.

The plating film 50 is formed on predetermined areas of the wiring portions 41 to 45. The object of forming the plating film 50 is to improve connection reliability between members or the like to be connected to corresponding parts of the wiring portions 41 to 45 and the corresponding parts of the wiring portions 41 to 45.

For example, the plating film 50 is made of Ni or a Ni alloy/Au or a Au alloy, Ni or a Ni alloy/Pd or a Pd alloy/Au or a Au alloy, Ni or a Ni alloy/Pd or a Pd alloy/Ag or a Ag alloy/Au or a Au alloy, Ag or a Ag alloy, Ni or a Ni alloy/Ag or a Ag alloy, Ni or a Ni alloy/Pd or a Pd alloy/Ag or a Ag alloy, or the like. In this, the expression of "AA/BB" means a film of AA and a film of BB are laminated in this order on the location where the plating film 50 is formed (similar when three or more films are formed).

It is preferable that the thicknesses of the Au film or the Au alloy film and the Ag film or the Ag alloy film are 0.1 μm or greater. It is preferable that the thickness of the Pd film or the Pd alloy film is 0.005 μm or greater. It is preferable that the thickness of the Ni film or the Ni alloy film is 0.5 μm or greater.

Because the reflectance ratios of an Ag film and an Ag alloy film are high, if the uppermost layer of the plating film 50 is the Ag film or the Ag alloy film, the reflectance ratio of light emitted by a light-emitting element can be preferably increased.

Referring to FIG. 2, light-emitting element mounting areas 51 are formed by the plating film 50 which is formed on adjacent wiring portions so as to face the adjacent wiring portions, respectively. For example, the light-emitting element mounting areas 51 are formed by the plating film 50, which are shaped like semicircles in their plan views. The plating film 50 faces the wiring portions. One light-emitting element having two terminals may be installed in the light-emitting element mounting area 51. However, one light-emitting element having four terminals may be installed in the light-emitting element mounting area 51.

Specifically, a plurality of the light-emitting element mounting areas 51 may be formed on the adjacent wiring portions in the wiring portions 41 to 45. Said differently, in the wiring portions 41 to 45, the plural light-emitting elements can be arranged in parallel over gaps between the adjacent wiring portions. For example, plural light-emitting elements (four light-emitting elements in the first embodiment) may be arranged in parallel along the longitudinal directions of the adjacent wiring portions 41 and 42 on the adjacent wiring portions 41 and 42. In a manner similar to the above, the plural light-emitting elements may be arranged in parallel along the longitudinal directions of the adjacent wiring portions 42 and 43, the adjacent wiring portions 43 and 44, or the adjacent wiring portions 44 and 45 on the adjacent wiring portions 42 and 43, the adjacent wiring portions 43 and 44, or the adjacent wiring portions 44 and 45.

Further, the plural light-emitting elements can be arranged in series along the direction of arranging the wiring portions (i.e., the X direction). For example, the light-emitting elements (four light-emitting elements in the first embodiment) can be arranged in series over the gap between the adjacent wiring portions 41 and 42, the gap between the adjacent wiring portions 42 and 43, the gap between the adjacent wiring portions 43 and 44, and the gap between the adjacent wiring portions 44 and 45.

For example, the light-emitting element mounting area 51 may be formed by arranging the plating film shaped in a rectangular shape in its plan view so as to face the adjacent wiring portions, respectively. With the first embodiment, sixteen light-emitting element mounting areas 51 are formed to accept mounting sixteen light-emitting elements. However, the number of the light-emitting element mounting areas 51 can be arbitrarily determined.

On the wiring portion 41, a first electrode 52 is formed by the plating film 50. The first electrode 52 is electrically connected to parts of the light-emitting element mounting areas 51 formed on the wiring portion 41. On the wiring portion 45, a second electrode 53 is formed by the plating film 50. The second electrode 53 is electrically connected to parts of the light-emitting element mounting areas 51 formed on the wiring portion 45. The first electrode 52 and the second electrode 53 are connected to, for example, a power source, a driving circuit, or the like, which is arranged outside the light-emitting element mounting package 10.

The reflective film 60 is formed on or over the insulating layer 30 so as to cover the light-emitting element mounting portion 40. Referring to FIG. 1, the reflective film 60 includes opening portions 60x. Parts of the light-emitting element mounting areas 51 are exposed through the opening portion 60x. The surfaces of the wiring portions 41 to 45 on which the reflective film 60 for the wiring portions 41 to 45 are formed may be roughened. The object of roughening the surfaces of the wiring portions 41 to 45 on which the reflective film 60 for the wiring portions 41 to 45 are formed is to improve contact between the wiring portions 41 to 45 and the reflective film 60 by an anchor effect.

The material of the reflective film 60 may be, for example, an epoxy insulative resin, a silicone insulative resin, or the like. Preferably, the color of the reflective film 60 is white in order to increase the reflectance ratio for light emitted by the light-emitting elements. The reflective film 60 can be colored white by adding filler such as titanium oxide to the reflective film 60 so that the reflective film 60 contains the filler. Instead of titanium oxide, pigment such as $BaSO_4$ may be used to color the reflective film 60 white. The thickness of the reflective film 60 may be, for example, about 10 μm through about 50 μm.

Within the first embodiment, the reflective film 60 is not formed on or over parts of the insulating layer 30 exposed through the gaps between the adjacent wiring portions. However, the reflection film 60 may be formed to cover the exposed parts of the insulating layer 30, and parts of the light-emitting element mounting portion 40 and the plating film 50 in the vicinity of the exposed parts of the insulating layer 30.

Figure 5:
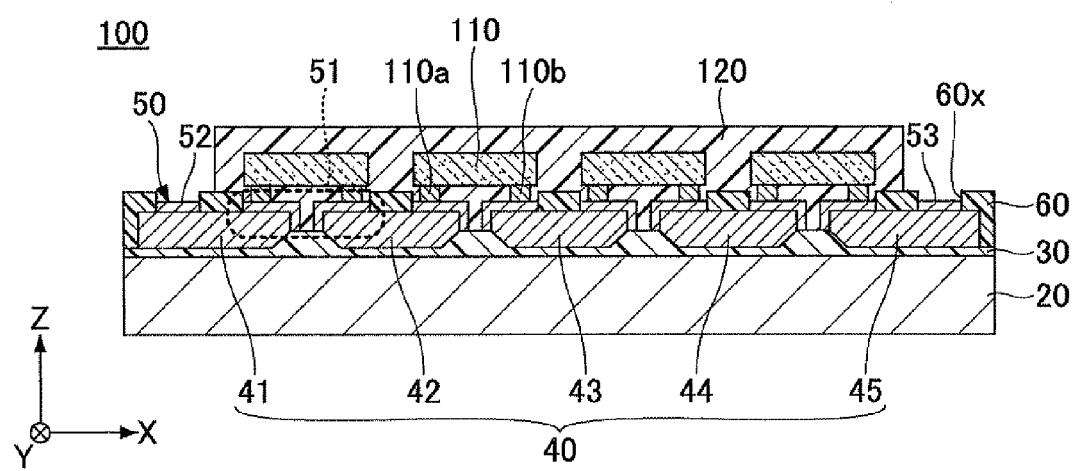
FIG. 5 is a cross-sectional view of a light-emitting element package of the first embodiment.

FIG. 5 is a cross-sectional view of a light-emitting element package of the first embodiment. Referring to FIG. 5, the light-emitting element package 100 is formed by mounting plural light-emitting elements 110 on the light-emitting element mounting areas 51 through the length and breadth of the light-emitting element mounting package 10. Then, the mounted light-emitting elements 110 are sealed by a sealing resin 120. The sealing resin 120 is formed to expose a part or all of each of the first electrode 52 and the second electrode 53.

The light-emitting elements 110 may be LEDs having an anodic terminal on one end and a cathodic terminal on the other end. However, the light-emitting element 110 is not limited to the LED. For example, a surface emitting laser or the like may be used. The sealing resin 120 may be an epoxy or silicone insulative resin or the like containing a fluorescent material.

Hereinafter, a case where the light-emitting element 110 is an LED and the light-emitting element package 100 is an LED module is exemplified. The light-emitting element 110 may be called the LED 110 and the light-emitting element package 100 may be called the LED module 100.

The dimensions of the LED 110 mounted on the light-emitting element mounting area 51 in its plan view is, for example, 0.3 mm in length (in the Y direction)×the 0.3 mm in width (in the X direction), 1.0 mm in length (in the Y direction)×1.0 mm in width (in the X direction), 1.5 mm in length (the Y direction)×1.5 mm in width (in the X direction), or the like.

Each LED 110 has a bump 110a as one electric terminal and a bump 110b as the other electric terminal. One of the bumps 110a and 110b is the anodic terminal, and the other of the bumps 110a and 110b is the cathodic terminal. For example, the bumps 110a and 110b are joined to the adjacent wiring portions by flip-chip bonding, respectively. The LEDs 110 are arranged in the same direction. In this case, the LEDs 110 are mounted so that the anode electrodes of the LEDs 110 are arranged to be directed to the left side in FIG. 5.

It is preferable to provide plural bumps 110a and plural bumps 110b for each LED 110. If the number of the bumps 110a and the number of the bumps 110b are one each, each terminal of the LED 110 is connected to the corresponding part of the light-emitting element mounting area 51 only at one position. Therefore, the LED 110 may be obliquely mounted. When the number of the bumps 110a and the number of the bumps 110b are plural, each terminal of the LED is supported at plural positions over the corresponding wiring portion 40. Therefore, the LEDs 110 are stably mounted on the light-emitting element mounting areas 51.

The gaps between the adjacent wiring portions are substantially the same as the gaps between the bumps 110a and 110b of the corresponding LEDs 110. The gaps may be, for example, 60 μm. Thus, the LEDs 110 are mounted in series between the wiring portion 41 and the wiring portion 42, between the wiring portion 42 and the wiring portion 43, between the wiring portion 43 and the wiring portion 44, and between the wiring portion 44 and the wiring portion 45 (the X direction).

Further, the lengths of the wiring portions 41 to 45 in the Y direction is several times to several tens of times the lengths of the LEDs 110 in the Y direction. Therefore, plural LEDs 110 are mounted in parallel over the wiring portion 41 and the wiring portion 42 in the Y direction. Similarly, plural LEDs 110 are mounted in parallel over the wiring portion 42 and the wiring portion 43, the wiring portion 43 and the wiring portion 44, and the wiring portion 44 and the wiring portion 45 in the Y direction.

[Manufacturing Method of Light-Emitting Element Mounting Package of the First Embodiment, and Manufacturing Method of Light-Emitting Element Package]

Next, a manufacturing method of the Light-emitting element mounting package 10 of the first embodiment, and a manufacturing method of a light-emitting element package 100 are described. FIGS. 6 to 19 illustrate the manufacturing process of the light-emitting element mounting package of the first embodiment. FIGS. 20 to 24 illustrate the manufacturing process of the light-emitting element mounting package of the first embodiment. The manufacturing processes are basically illustrated by cross-sectional views. However, when necessary, the manufacturing processes are illustrated by (a) as a plan view and (b) as a cross-sectional view.

Figure 6:
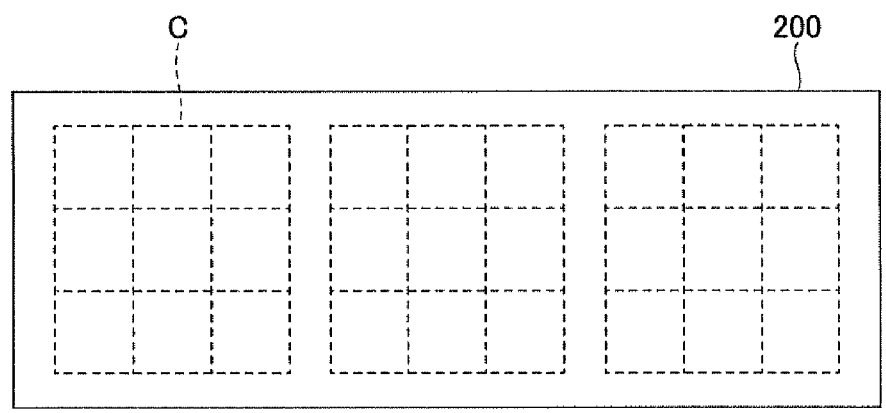
FIG. 6 illustrates a process of manufacturing a light-emitting element mounting package of the first embodiment.
Figure 7:
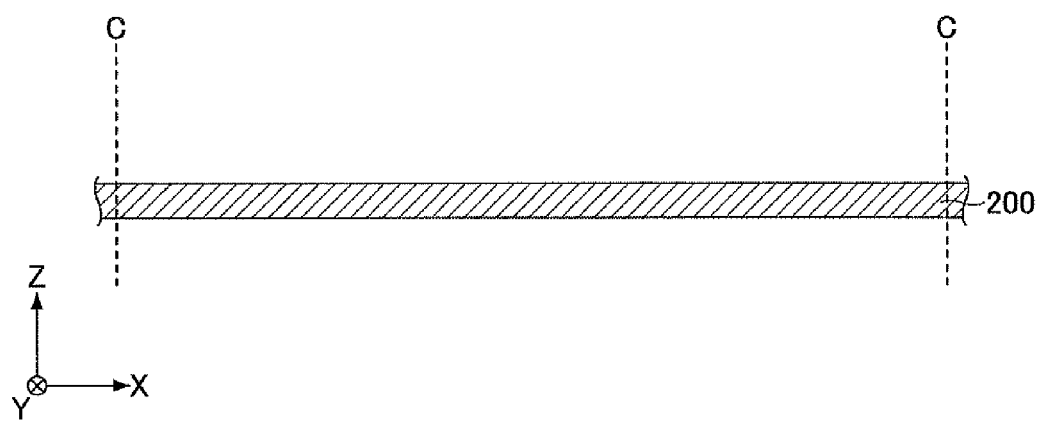
FIG. 7 further illustrates the process of manufacturing the light-emitting element mounting package of the first embodiment.

Referring to FIGS. 6 and 7, a metallic foil 200 is prepared. As illustrated, FIG. 6 is a plan view where cut lines are indicated by "C". Plural light-emitting element mounting packages 10 (27 pieces) are obtained by cutting the metallic foil 200 or the like processed by predetermined steps illustrated in FIGS. 8 to 19. Said differently, the areas surrounded by the cut lines C illustrated in FIG. 6 is going to be the light-emitting element mounting packages 10. Referring to FIG. 7, a cross-sectional view taken along the line 3A-3A in FIG. 1 is illustrated. FIG. 6 illustrates one of the areas surrounded by the cut lines C.

The metallic foil 200 is, for example, a copper foil or the like. For example, the planar shape of the metallic foil 200 is rectangular. The dimensions of the metallic foil 200 are, for example, about 650 mm in length (in the Y direction)×about 510 mm in length (in the X direction)×about 100 μm in thickness (in the Z direction). The metallic foil 200 finally becomes the light-emitting element mounting portion 40.

Figure 8:
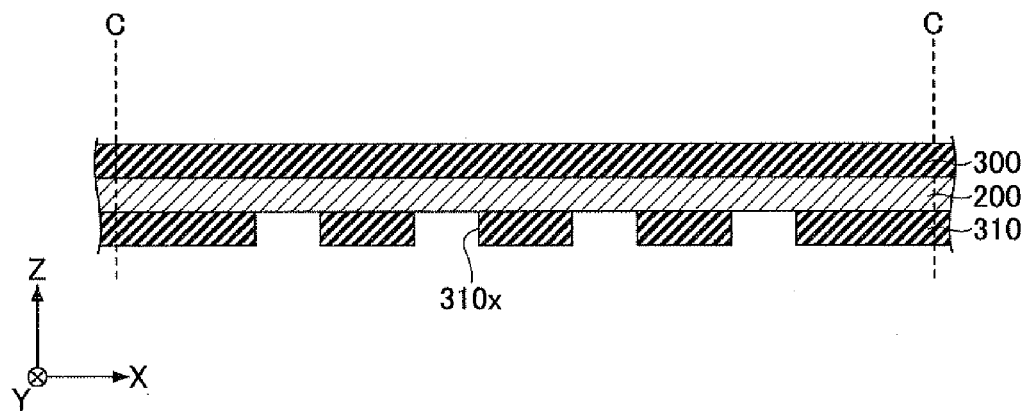
FIG. 8 further illustrates the process of manufacturing the light-emitting element mounting package of the first embodiment.

Referring to FIG. 8, a resist layer 300 covering the upper surface of the metallic foil 200 in its entirety is formed, and a resist layer 310 having opening portions 310x through which parts of the lower surfaces of the metallic foil 200 are exposed is formed below the lower surface of the metallic foil 200. For example, in order to form the resist layers 300 and 310, a resist in liquid or paste form made of a photosensitive resin material which contains an epoxy resin, an acrylic resin or the like is coated on the upper and lower surfaces of the metallic foil 200. Instead, for example, a resist in film form (e.g., a dry film resist) made of a photosensitive resin material which contains an epoxy resin, an acrylic resin or the like is laminated on the upper and below lower surfaces of the metallic foil 200.

By irradiating the resist coated on or laminated below the metallic foil 200 with light and developing the resist, the opening portions 310x are formed. With this, the resist layer 300 covering the upper surface of the metallic foil 200 in its entirety and the resist layer 310 having opening portions 310x through which the parts of the lower surfaces of the metallic foil 200 are exposed is formed below the lower surface of the metallic foil 200. It is possible to laminate a resist in film form previously provided with the opening portions 310x below the lower surface of the metallic foil 200.

Figure 9:
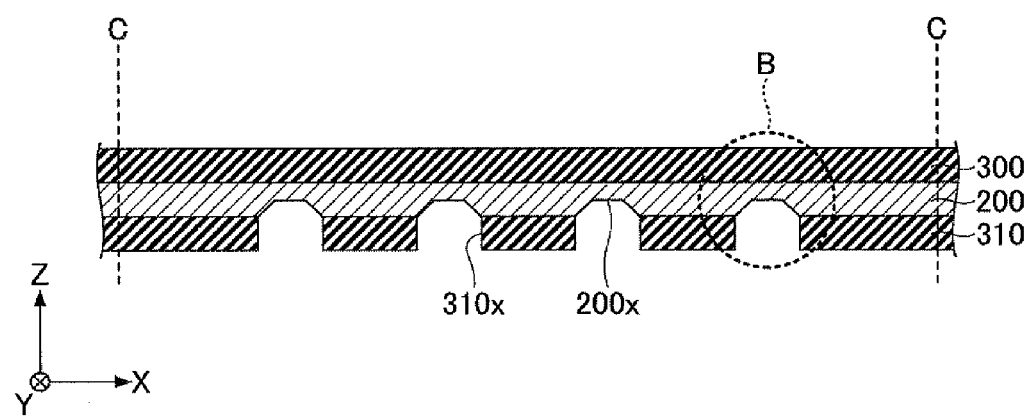
FIG. 9 further illustrates the process of manufacturing the light-emitting element mounting package of the first embodiment.
Figure 10:
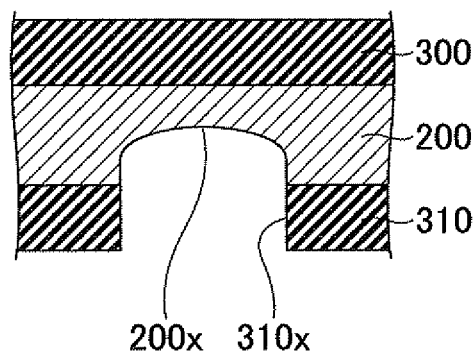
FIG. 10 further illustrates the process of manufacturing the light-emitting element mounting package of the first embodiment.
Figure 11A:
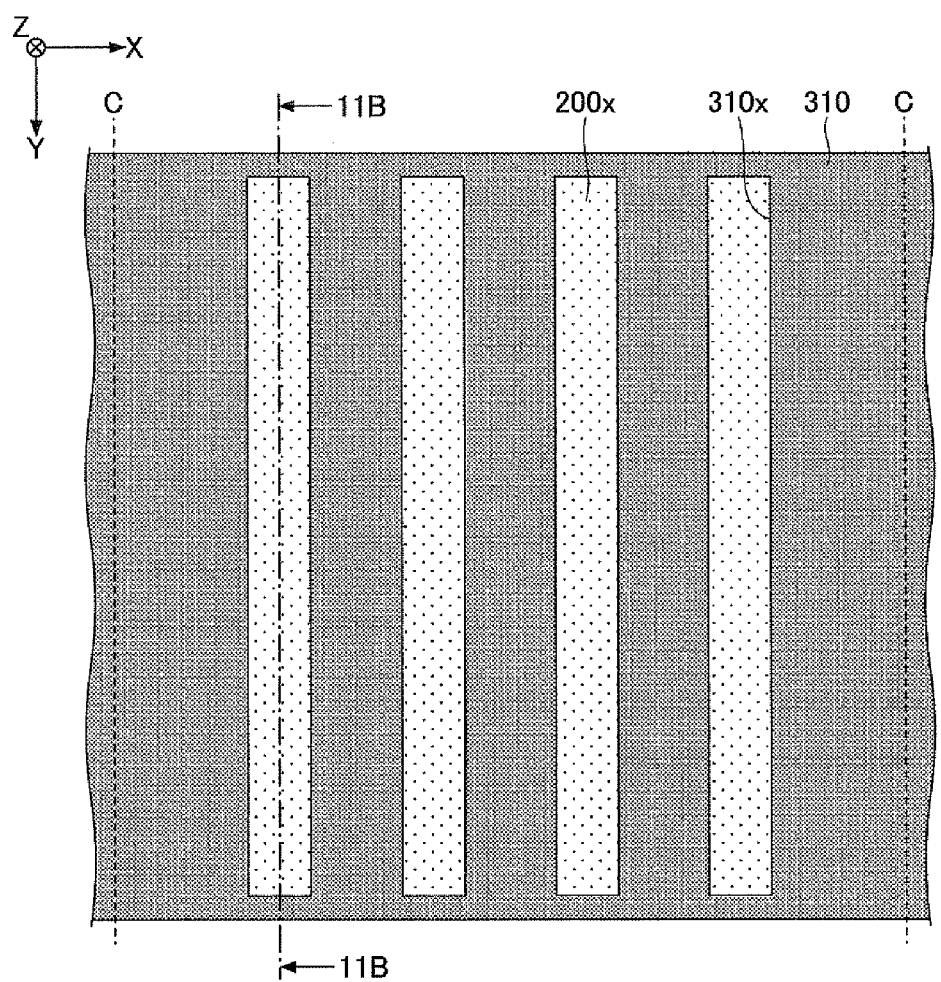
FIG. 11A further illustrates the process of manufacturing the light-emitting element mounting package of the first embodiment.
Figure 11B:
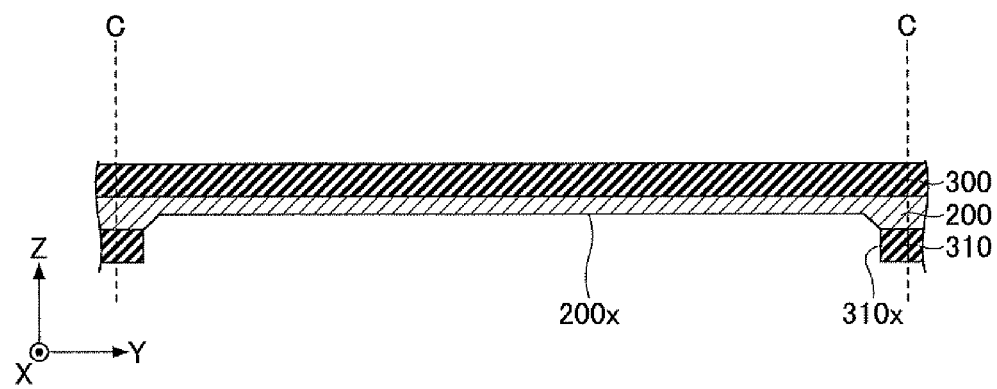
FIG. 11B illustrates a cross-sectional view of the light-emitting element mounting package illustrated in FIG. 11A taken along a line 11B-11B.

Next, referring to FIGS. 9 to 11B, grooves 200x are formed by half etching the parts of the metallic foil 200 exposed through the opening portion 310x. The plural grooves 200x are in long and thin shapes and are arranged in the Y direction. In a case where the metallic foil 200 is made of a copper foil, the metallic foil 200 can be half etched using, for example, aqueous ferric chloride, aqueous copper chloride, aqueous ammonium persulfate, or the like. FIG. 10 is an enlarged cross-sectional view of a portion B in FIG. 9. FIG. 11A is a bottom view illustrated in FIG. 9 viewed from the outer side of the resist layer 310 to the inner side. FIG. 11B is a cross-sectional view taken along a line 11B-11B in FIG. 11A.

The center portion of the groove 200x and vicinities of the center portion are finally removed to form the cutout portions of the adjacent wiring portions in the light-emitting element mounting portion 40. The cross-sectional shape of the grooves 200x is like U or the like, for example. The width of the grooves may be about 200 μm. The depth of the grooves 200x may be, for example, about 70 μm. The grooves 200x may be formed by blasting, stamping, or the like instead of the half etching.

Figure 12:
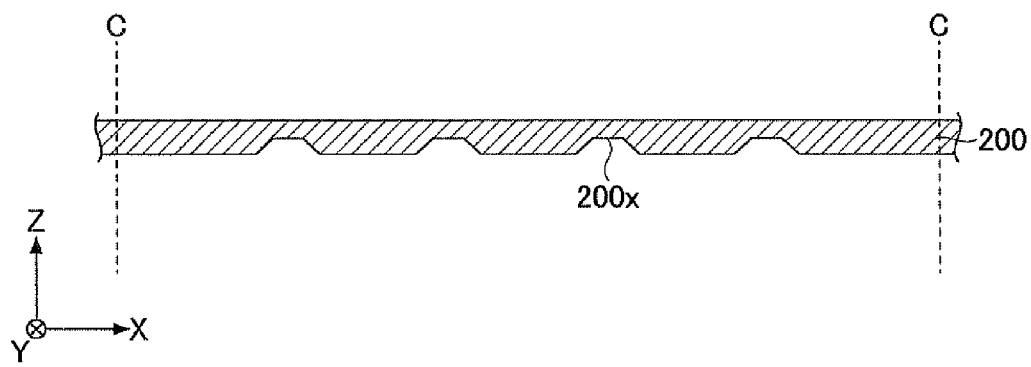
FIG. 12 further illustrates the process of manufacturing the light-emitting element mounting package of the first embodiment.
Figure 13:
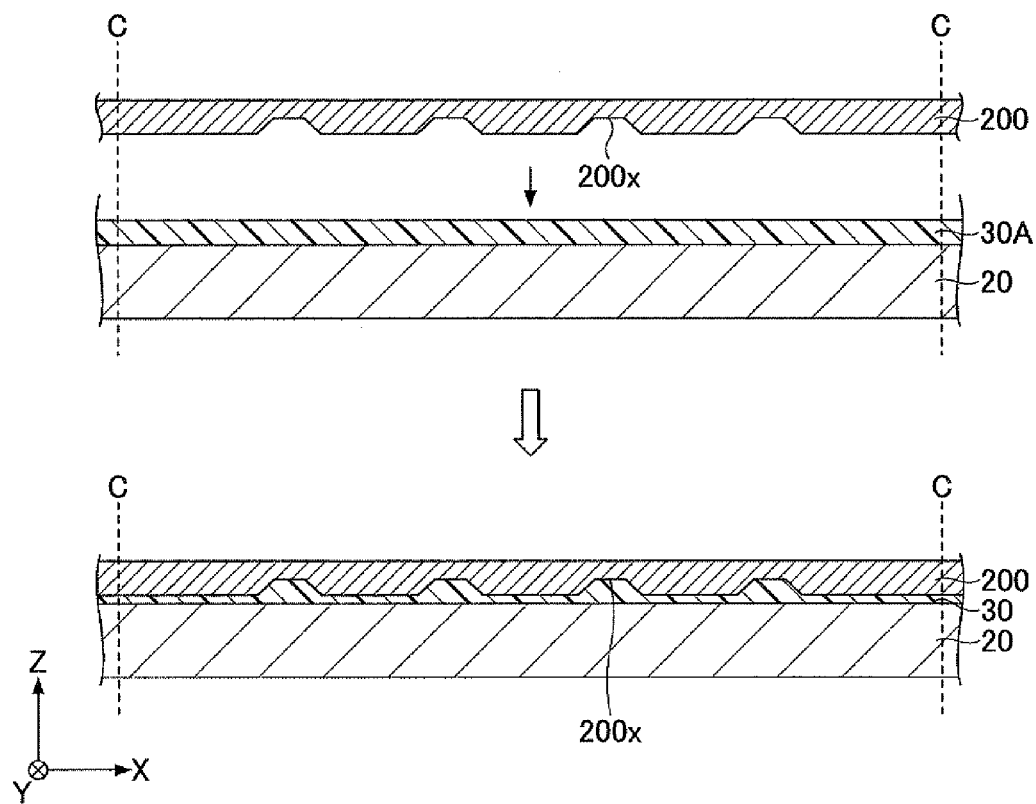
FIG. 13 further illustrates the process of manufacturing the light-emitting element mounting package of the first embodiment.

Referring to FIG. 12, the resist layers 300 and 310 illustrated in FIG. 9 or the like are removed. Referring to FIG. 13, the metallic foil 200 on which the grooves 200x are formed is joined to the metallic plate 20 via the insulating layer 30 to cover the lower surface of the metallic foil 200 and the grooves 200x with the insulating layer 30. Specifically, the insulative resin 30A in the B-stage state (the semi-hardened state) is laminated on the upper surface of the metallic plate 20 to thereby further laminate the metallic foil 200 on which the grooves 200x are formed.

The metallic foil 200 is pressed against the insulative resin 30A toward the metallic plate 20 while heating the insulative resin 30A. Alternatively, after pressing the metallic foil 200 against the insulative layer 30A, heating the metallic foil 200, and laminating the metallic foil 200 on the insulative resin 30A, the laminated metallic foil and the insulative resin 30A may be heated by an oven or the like without pressing the metallic foil 200. Then, the insulative resin 30A is hardened to become the insulating layer 30. The material of the insulative resin 30A (the insulating layer 30) is, for example, an epoxy resin in which a filler such as alumina or the like is contained.

Figure 14A:
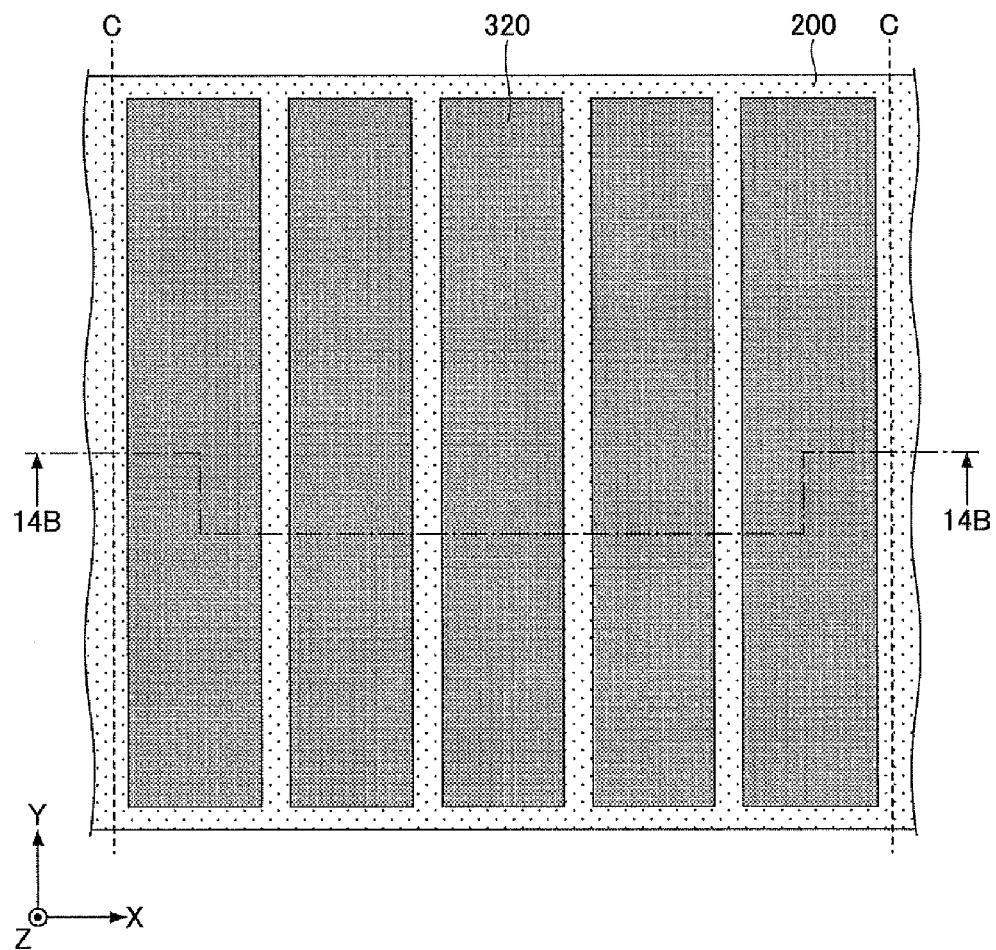
FIG. 14A further illustrates the manufacturing process of manufacturing the light-emitting element mounting package of the first embodiment.
Figure 14B:
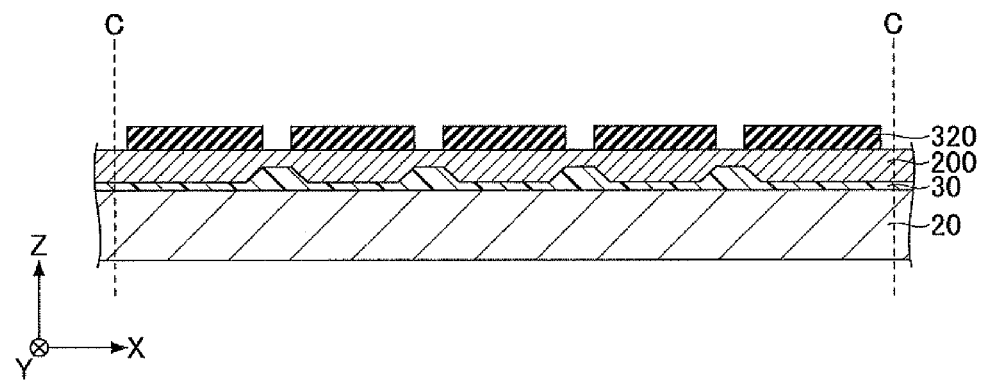
FIG. 14B illustrates a cross-sectional view of the light-emitting element mounting package illustrated in FIG. 14A taken along a line 14B-14B.

Referring to FIGS. 14A and 14B, resist layers 320 are formed on the upper surfaces of the metallic foil 200. The resist layers 320 are formed to cover portions of the light-emitting element mounting portion 40 which are to be the wiring portions 41 to 45. At this time, parts of the upper surfaces of the wiring portions above the wiring portions 41 to 45 are also covered. The resist layers 320 may be formed with a process similar to the process of forming the resist layers 300 and 310 illustrated in, for example, FIG. 8.

Figure 15:
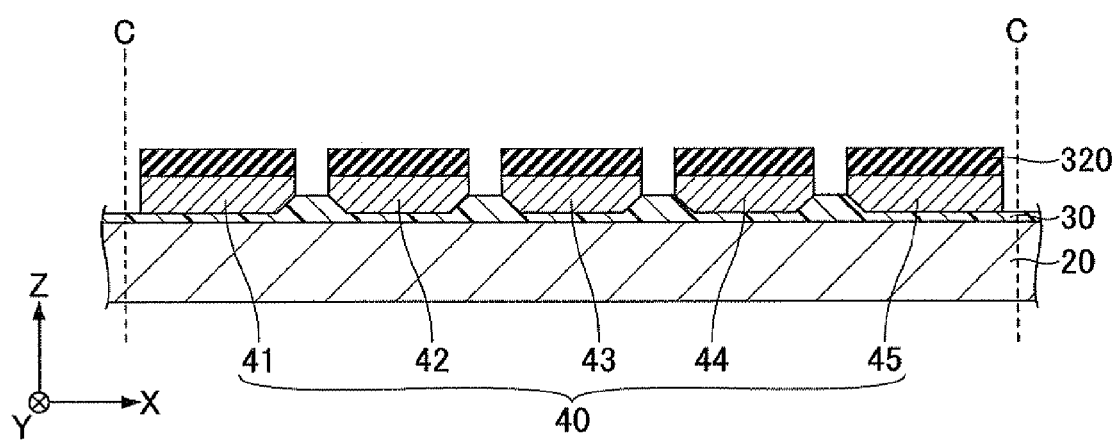
FIG. 15 further illustrates the process of manufacturing the light-emitting element mounting package of the first embodiment.

Referring to FIG. 15, the parts of the metallic foil 200 which are not covered by the resist layer 320 (i.e., parts of the metallic foil 200 corresponding to the grooves 200x) are removed by etching. Thus, the light-emitting element mounting portion 40 is formed so that predetermined gaps are interposed between the wiring portions 41 to 45. In a case where the metallic foil 200 is made of a copper foil, the metallic foil 200 can be etched using, for example, aqueous ferric chloride, aqueous copper chloride, aqueous ammonium persulfate, or the like. In this process, the cutout portions 40y are formed of the inner walls of the groove 200x on the lower side of the side edge portions 40x of the adjacent wiring portions (see FIG. 4), which face each other.

Figure 16A:
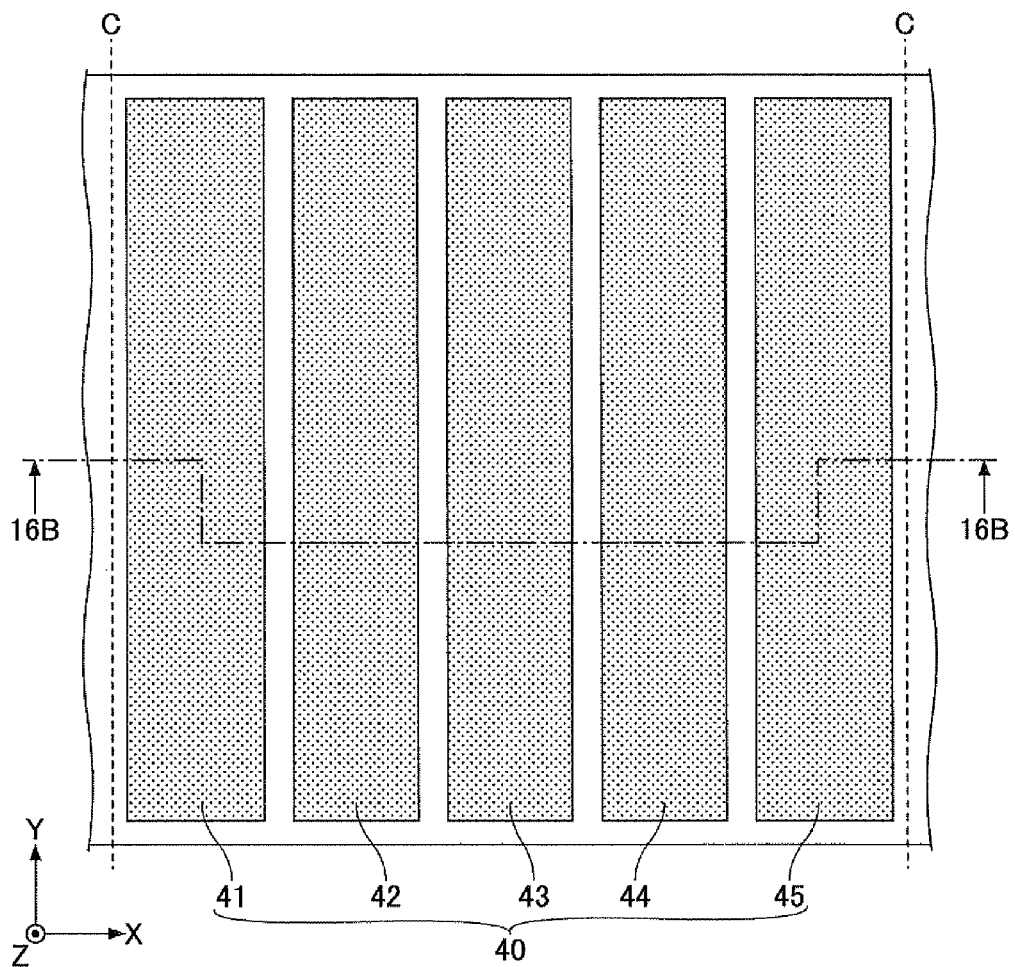
FIG. 16A further illustrates the process of manufacturing the light-emitting element mounting package of the first embodiment.
Figure 16B:
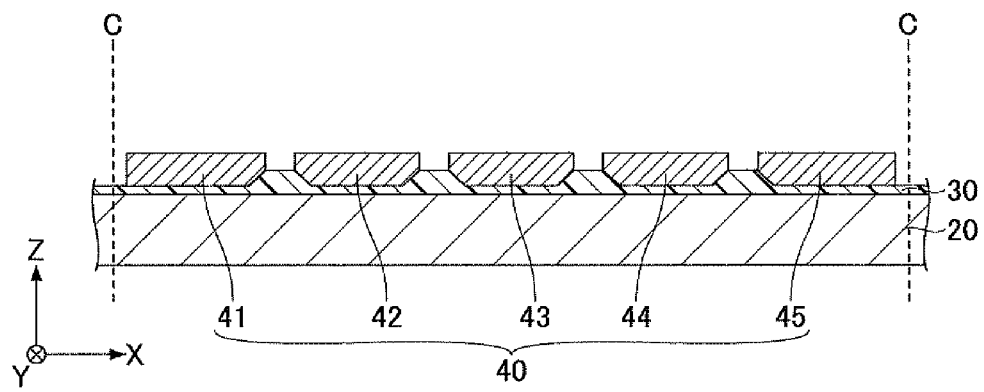
FIG. 16B illustrates a cross-sectional view of the light-emitting element mounting package illustrated in FIG. 16A taken along a line 16B-16B.

Referring to FIGS. 16A and 16B, the resist films 320 illustrated in FIG. 15 are removed. With this, the wiring portions 41 to 45 of the light-emitting element mounting portion 40 are exposed to the outside.

Figure 17A:
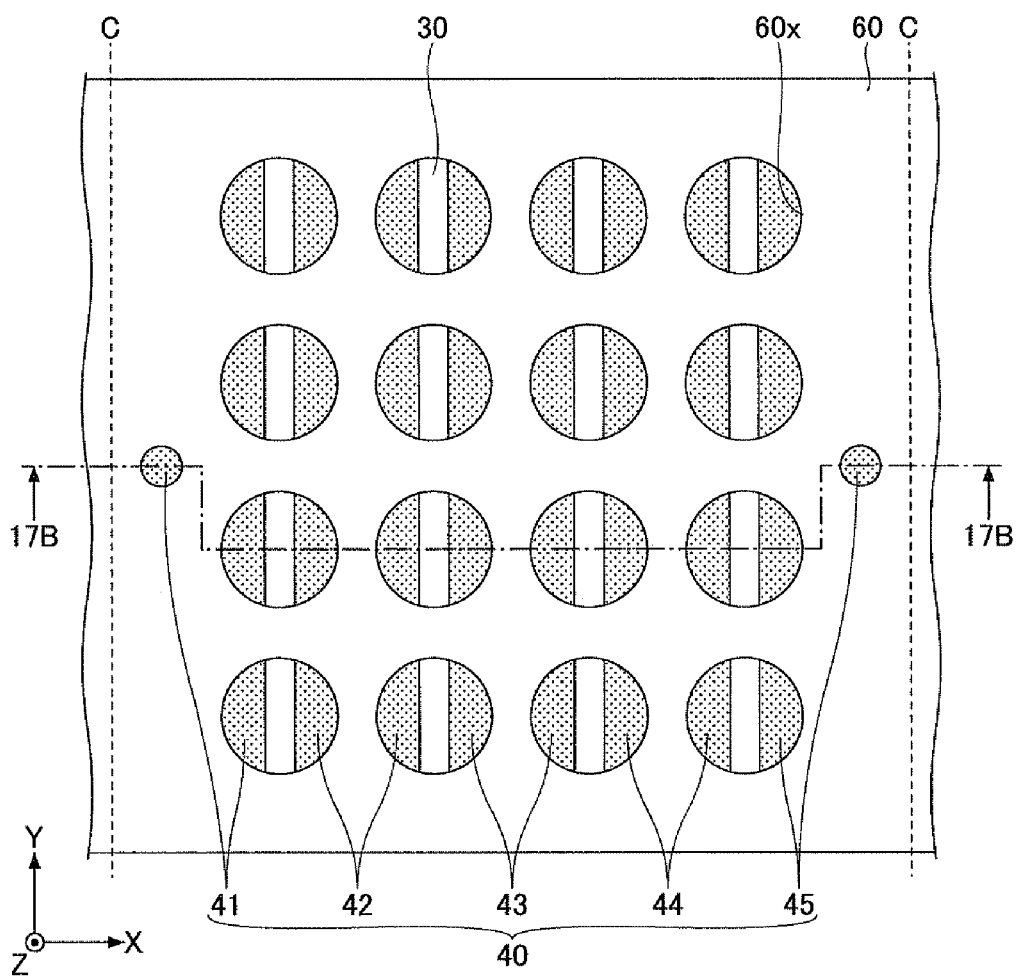
FIG. 17A further illustrates a manufacturing process of the light-emitting element mounting package of the first embodiment.
Figure 17B:
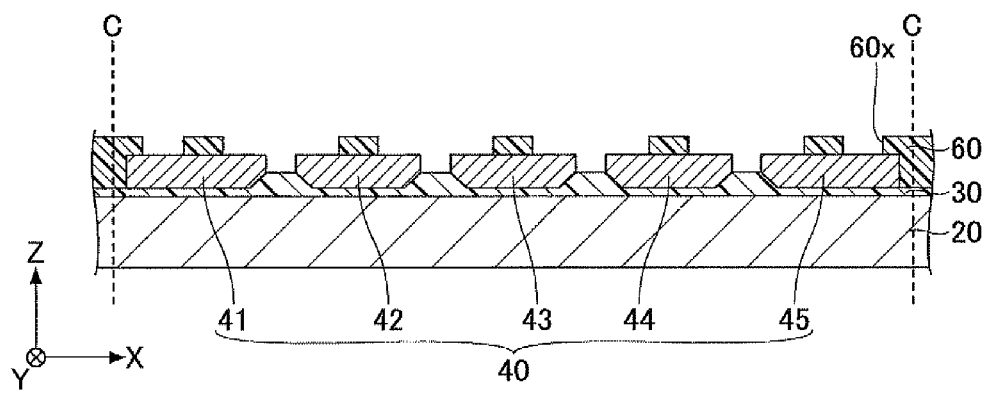
FIG. 17B illustrates a cross-sectional view of the light-emitting element mounting package illustrated in FIG. 17A taken along a line 17B-17B.

Referring to FIGS. 17A and 17B, the reflective film 60 having opening portions 60x is formed so as to cover a part of the insulating layer and a part of the light-emitting element mounting portion 40. The material of the reflective film 60 may be, for example, an epoxy insulative resin, a silicone insulative resin, or the like. Preferably, the color of the reflective film 60 is white in order to increase the reflectance ratio for light emitted by the light-emitting elements. The reflective film 60 can be colored white by adding filler such as titanium oxide to the reflective film 60 so that the reflective film 60 contains the filler. Instead of titanium oxide, pigment such as $BaSO_4$ may be used to color the reflective film 60 white. The thickness of the reflective film 60 may be, for example, about 10 μm through about 50 μm.

In order to form the reflective film 60, an epoxy or silicone photosensitive insulating resin in liquid or paste form is coated on the insulating layer 30 and the light-emitting element mounting portion 40 to cover the insulating layer 30 and the light-emitting element mounting portion 40. Instead, an epoxy or silicone photosensitive insulating resin in film form is laminated on the insulating layer 30 and the light-emitting element mounting portion 40 so as to cover the insulating layer 30 and the light-emitting element mounting portion 40. By irradiating the coated or laminated insulating resin with light and developing the coated or laminated insulating resin, the opening portions 60x are formed. With this, the reflective film 60 having the opening portions 60x is formed. An epoxy or silicone insulating resin in film form, in which the opening portions 60x are previously formed, may be laminated on the insulating layer 30 and the light-emitting element mounting portion 40 so as to cover a part of the insulating layer 30 and a part of the light-emitting element mounting portion 40. An epoxy or silicone nonphotosensitive insulating resin, in which the opening portions 60x are previously formed, may be screen-printed to form the reflective film 60. By previously roughening the wiring portions 41 to 45 of the light-emitting element mounting portion 40, contact between the wiring portions 41 to 45 and the reflective film 60 is improved. Such improvement in the contact is preferable.

Figure 18:
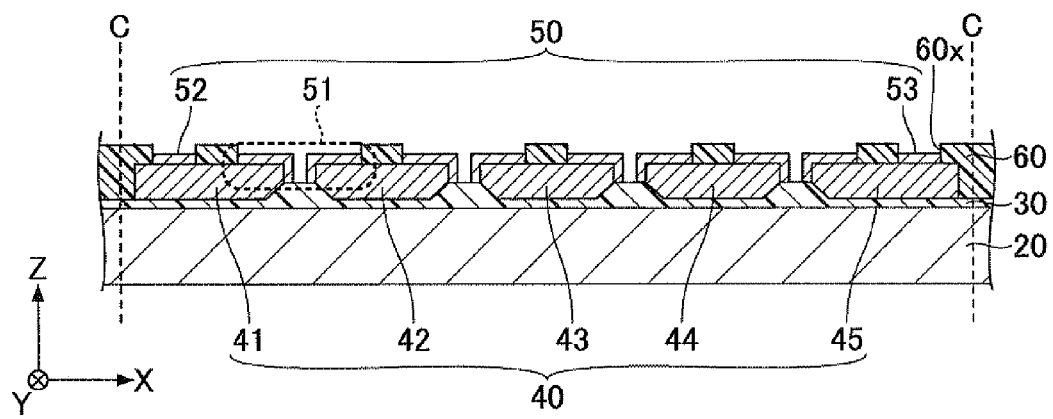
FIG. 18 further illustrates the process of manufacturing the light-emitting element mounting package of the first embodiment.

Referring to FIG. 18, the plating film 50 including light-emitting element mounting areas 51, first electrodes 52, and second electrodes 53 are formed by, for example, electroless plating on the light-emitting element mounting portion 40 which is exposed through the opening portions 60x. The type, the thickness and so on of the plating film 50 are as described above. Because the reflectance ratios of an Ag film and an Ag alloy film are high, if the uppermost layer of the plating film 50 made of the Ag film or the Ag alloy film is formed, the reflectance ratio of light emitted by a light-emitting element can be increased. Such an increment of the reflectance ratio is preferable.

Figure 19:
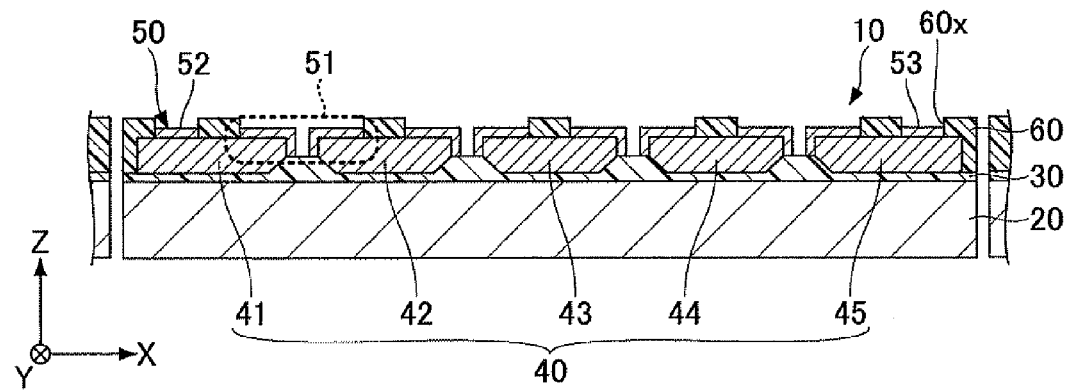
FIG. 19 further illustrates the process of manufacturing the light-emitting element mounting package of the first embodiment.

Referring to FIG. 19, by cutting the structure illustrated in FIG. 18 along the cut lines C, plural light-emitting element mounting packages 10 can be completed. The structure illustrated in FIG. 18 can be cut by, for example, a dicing blade. Alternatively, the structure illustrated in FIG. 18 can be V-cut.

The product form for selling may be the structure (i.e., the light-emitting element mounting package 10) illustrated in FIG. 1 or the structure (i.e., the aggregation of the light-emitting element mounting packages 10) illustrated in FIG. 18.

Figure 20:
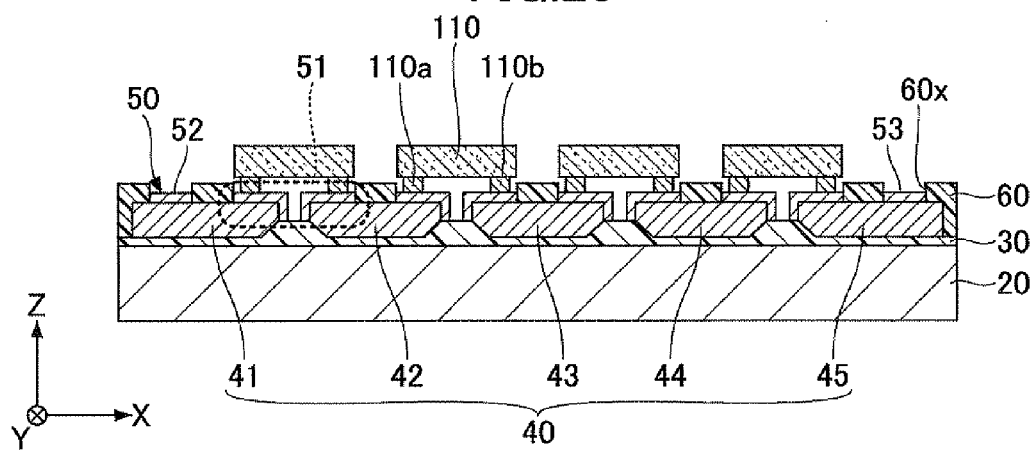
FIG. 20 illustrates a process of manufacturing a light-emitting element package of the first embodiment.

In a case where the LED module 100 is manufactured, LEDs 110 are mounted on the light-emitting element mounting areas 51 of the light-emitting element mounting package 10 as illustrated in FIG. 20. Each LED 110 has a bump 110a as one electric terminal and a bump 110b as the other electric terminal. For example, each LED 110 can be connected to the corresponding light element mounting area 51 by flip-chip bonding.

Figure 21:
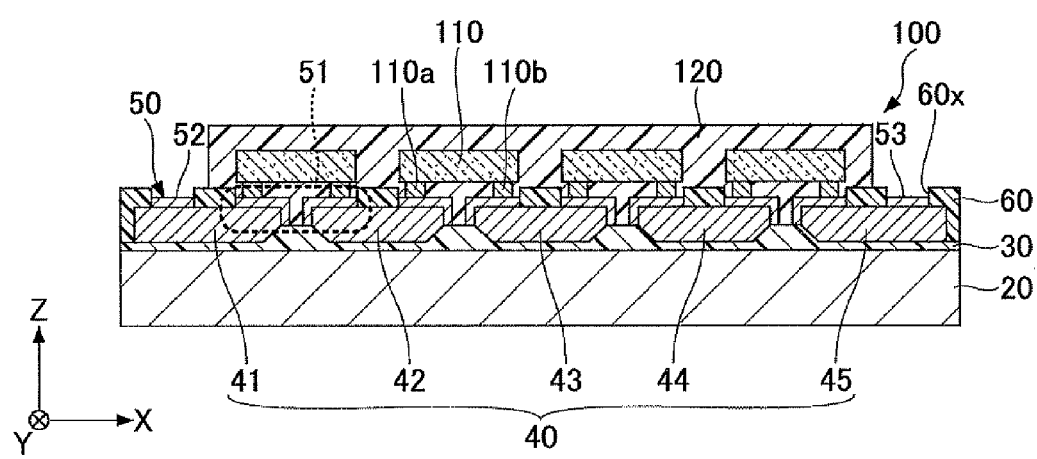
FIG. 21 further illustrates the process of manufacturing the light-emitting element package of the first embodiment.

Referring to FIG. 21, the LEDs 110 are sealed by the sealing resin 120. The sealing resin 120 may be an epoxy or silicone insulative resin or the like containing a fluorescent material. The sealing resin 120 may be formed by, for example, transfer molding or potting. Thus, the LED module 100 can be manufactured. Instead of simultaneously sealing the plural LEDs 110, the LEDs 110 can be individually sealed.

Figure 22:
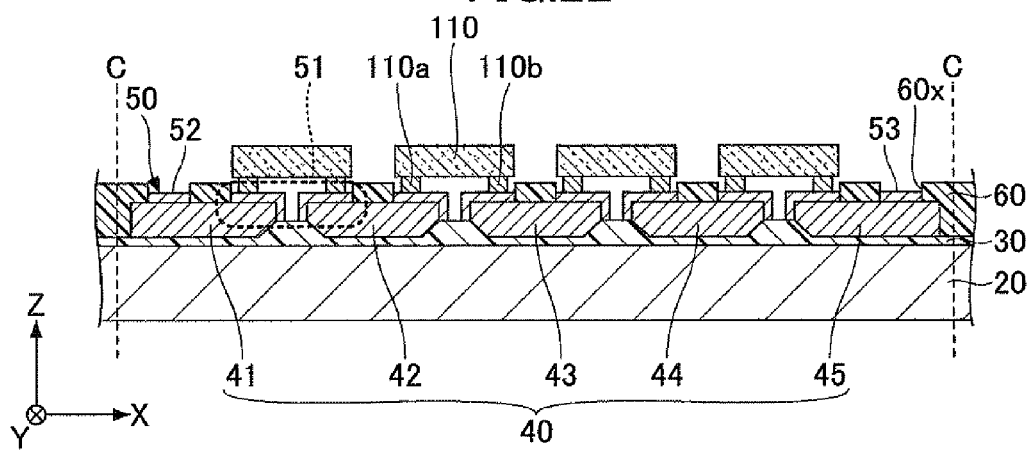
FIG. 22 further illustrates the process of manufacturing the light-emitting element package of the first embodiment.
Figure 23:
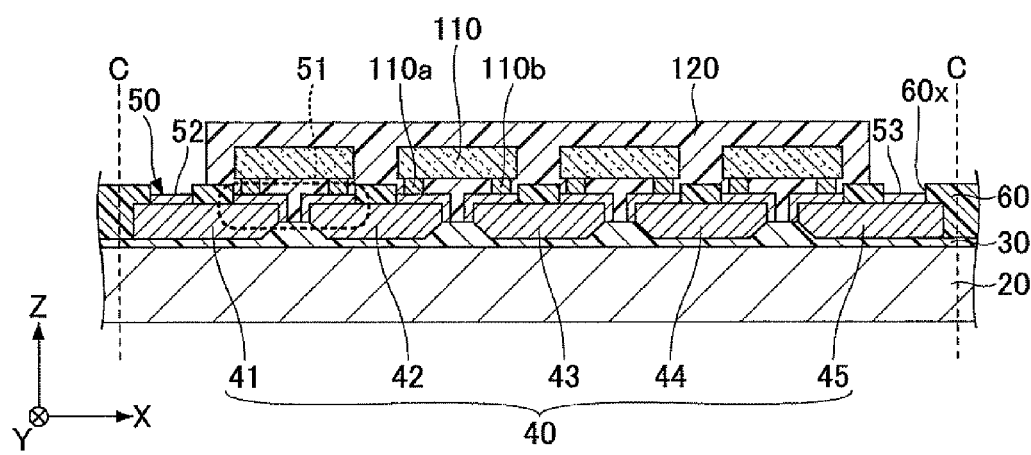
FIG. 23 further illustrates the process of manufacturing the light-emitting element package of the first embodiment.
Figure 24:
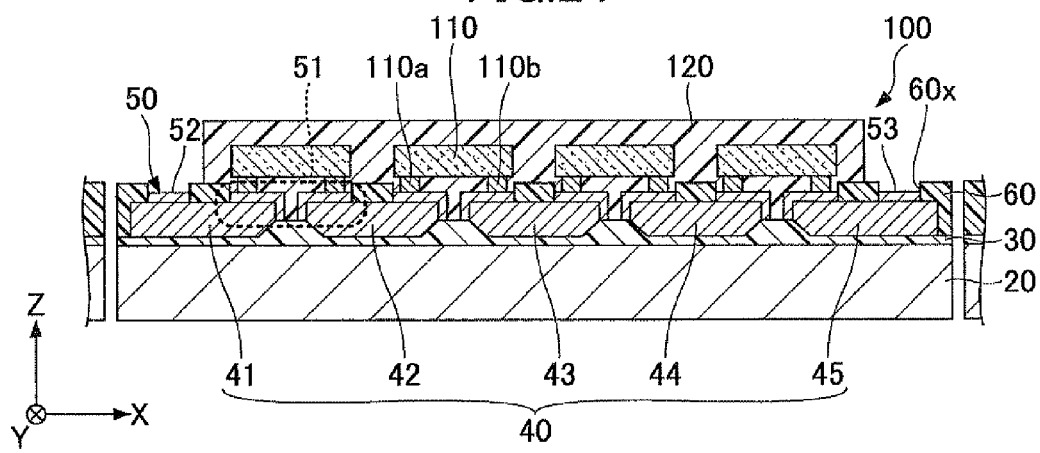
FIG. 24 further illustrates the process of manufacturing the light-emitting element package of the first embodiment.
Figure 25:
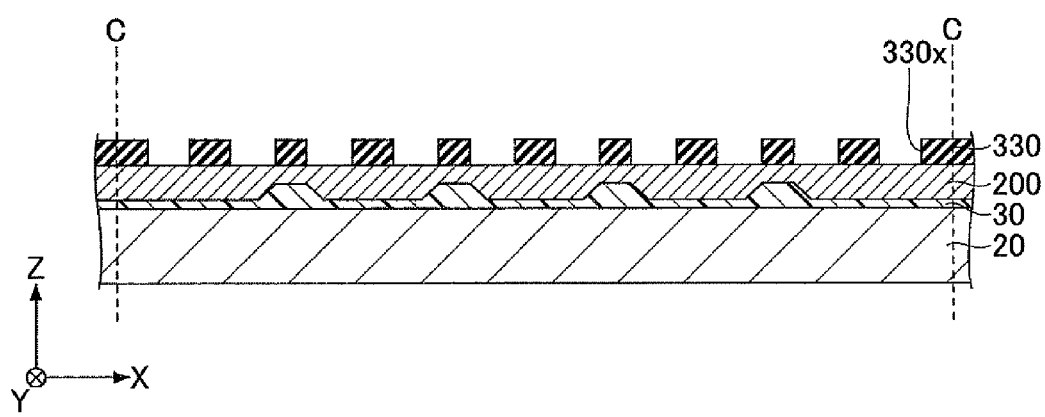
FIG. 25 illustrates a process of manufacturing a light-emitting element mounting package of a second embodiment.

When the LED module 100 is manufactured, the following processes may be employed instead. After the process illustrated in FIG. 18 and before cutting the structure along the cut lines C, plural LEDs 110 may be mounted on portions of the structure to be the light emitting element mounting packages 10 as illustrated in FIG. 22. Referring to FIG. 23, the LEDs 110 are sealed by the sealing resin 120 (in the portions of the structure to be the light emitting element mounting packages 10). Referring to FIG. 24, by cutting the structure illustrated in FIG. 23 along the cut lines C, the plural LED modules 100 are completed.

As described, in the light-emitting element mounting package 10 of the first embodiment, the grooves 200x are formed in predetermined areas of the lower surfaces of the metallic foils 200, the parts of the groove 200x in the metallic foil 200 are partly removed to thereby form the light-emitting element mounting portion 40 in which the plural wiring portions are arranged while interposing predetermined gaps between the plural wiring portions 41 to 45. The grooves 200x are arranged in the gaps between the adjacent wiring portions in the light-emitting element mounting portion 40. The part of the metallic foil 200 where the grooves 200x are formed is thinner than the part of the metallic foil 200 where the grooves 200x are not formed. Therefore, when the gaps between the adjacent wiring portions are narrow, the part of the metallic foil 200 where the grooves 200x are formed can be easily removed.

Said differently, when the metallic foil 200 is thick enough to have an excellent heat radiation property (e.g., about 100 μm), the gaps between the adjacent wiring portions are narrower than that in the past. For example, in the past, the gaps between the adjacent wiring portions have not been narrowed so as to be less than the double of the thickness of the metallic foil. Within the first embodiment, the gaps between the adjacent wiring portions can be narrowed so as to be less than the double of the thickness of the metallic foil (the thicknesses of the wiring portions 41 to 45).

[b] Second Embodiment

Within the second embodiment, an exemplary method of manufacturing the light-emitting element mounting package different from that in the first embodiment is described. In the second embodiment, explanation of constructional elements the same as those described in the above description of the first embodiment is omitted.

FIGS. 25 to 31 illustrate manufacturing processes of the light-emitting element mounting package of the second embodiment. At first, the processes illustrated in FIGS. 6 to 13 of the first embodiment are performed. Thereafter, in the process illustrated in FIG. 25, a resist layer 330 having opening portions 330x corresponding to the plating film 50 is formed on the upper surface of the metallic foil 200. The resist layer 330 may be formed in a manner similar to the process of forming the resist layer 300 illustrated in FIG. 8.

Figure 26:
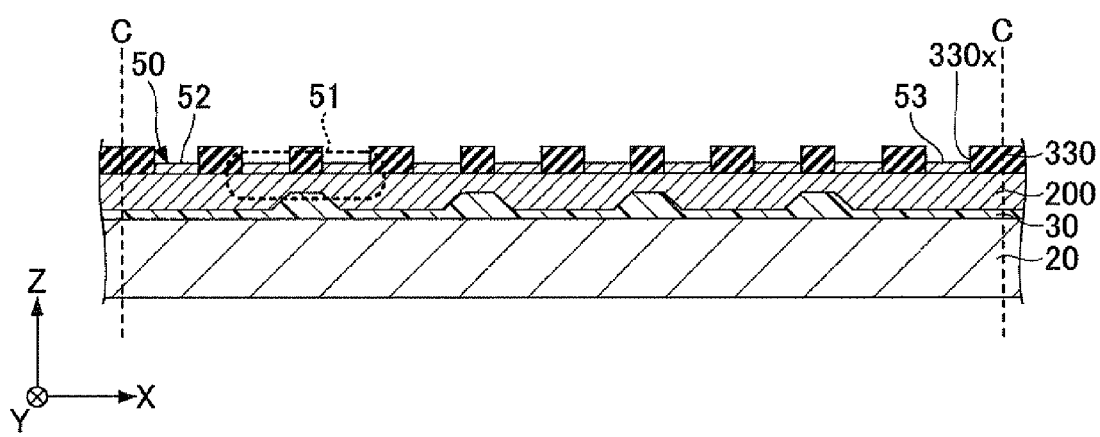
FIG. 26 further illustrates the process of manufacturing the light-emitting element mounting package of the second embodiment.

Referring to FIG. 26, the plating film 50 is formed on the upper surface of the metallic foil 200, which is exposed through the opening portions 330x, by an electroplating method using the metallic foil 200 as a power supply layer or the like. The type, the thickness and so on of the plating film 50 are as described above. Because the reflectance ratios of an Ag film and an Ag alloy film are high, if the uppermost layer of the electroplating film 50 is the plating film 50 made of the Ag film or the Ag alloy film, the reflectance ratio for light emitted by a light-emitting element can be increased. Such an increment of the reflectance ratio is preferable.

Figure 27A:
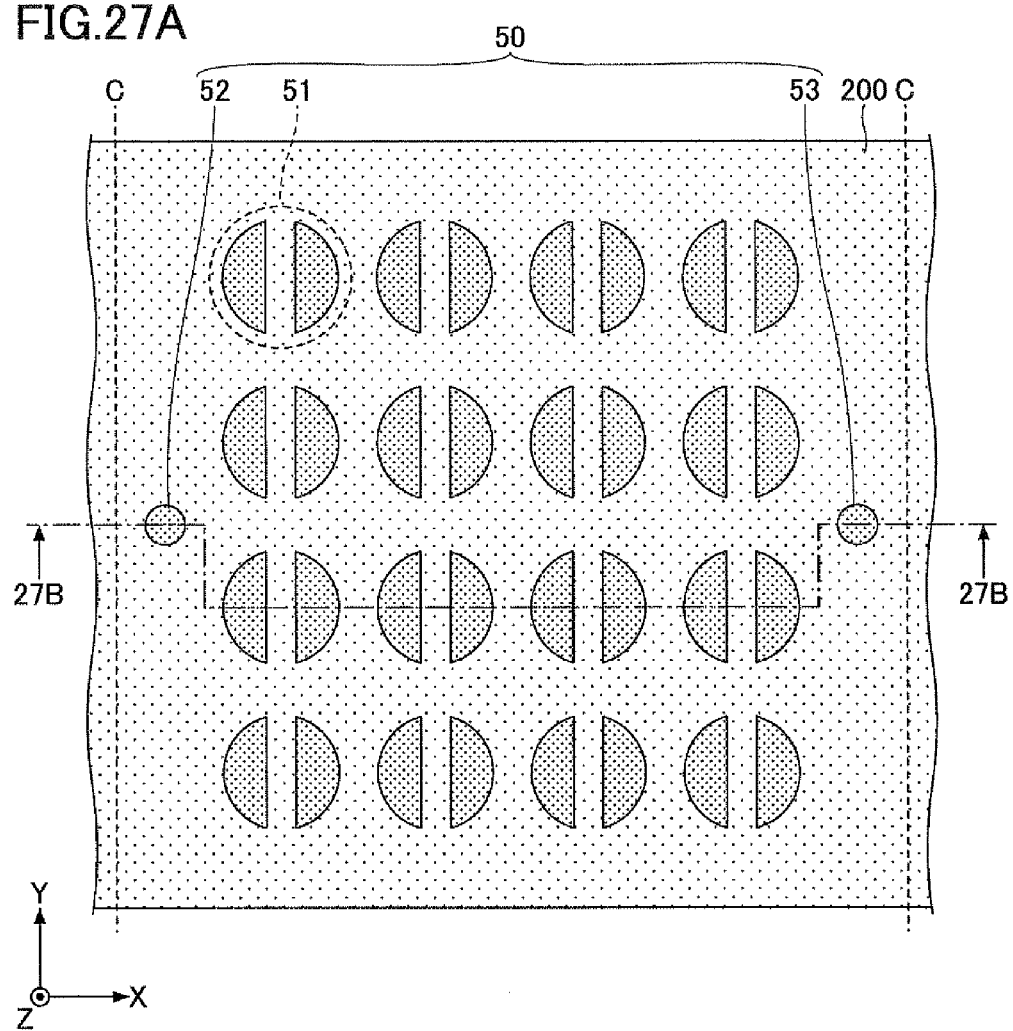
FIG. 27A further illustrates the process of manufacturing the light-emitting element mounting package of the second embodiment.
Figure 27B:
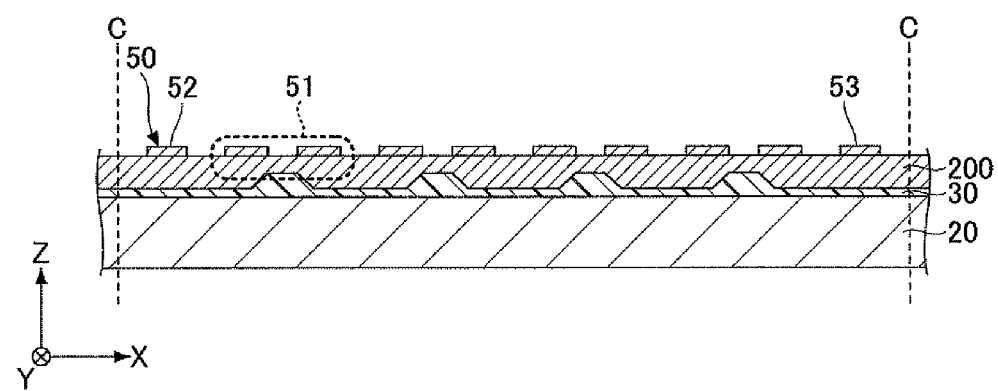
FIG. 27B illustrates a cross-sectional view of the light-emitting element mounting package illustrated in FIG. 27A taken along a line 27B-27B.

Referring to FIGS. 27A and 27B, the resist film 330 illustrated in FIG. 26 is removed. Then, the electroplating film 50 including light-emitting element mounting areas 51, a first electrode 52 and a second electrode 53 are formed on the upper surface of the metallic foil 200.

Figure 28:
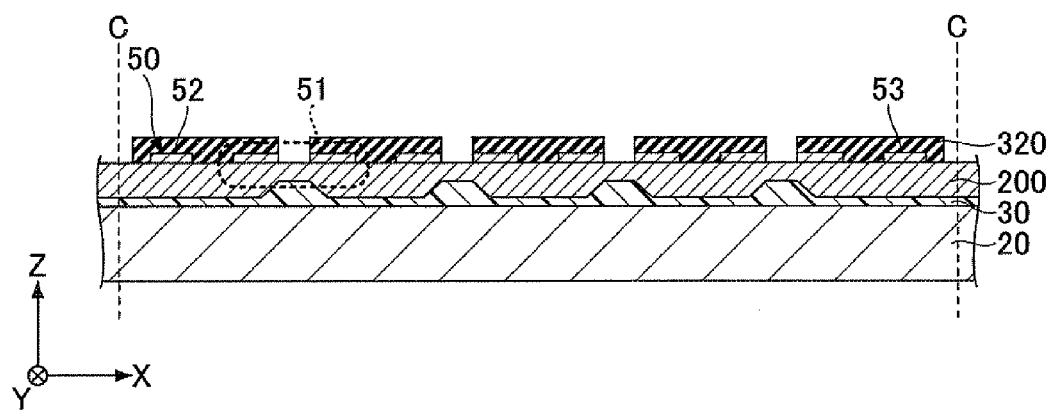
FIG. 28 further illustrates the process of manufacturing the light-emitting element mounting package of the second embodiment.

Referring to FIG. 28, the resist layer 320 is formed on the upper surface of the metallic foil 200 in a manner similar to the process illustrated in FIGS. 14A and 14B. The resist layer 320 is formed to cover portions of the light-emitting element mounting portion 40 which are to be the wiring portions 41 to 45. At this time, parts of the upper surfaces of the wiring portions above the cutout portions 40x are also covered. The resist layer 320 may cover side surfaces of the plating film 50.

Figure 29:
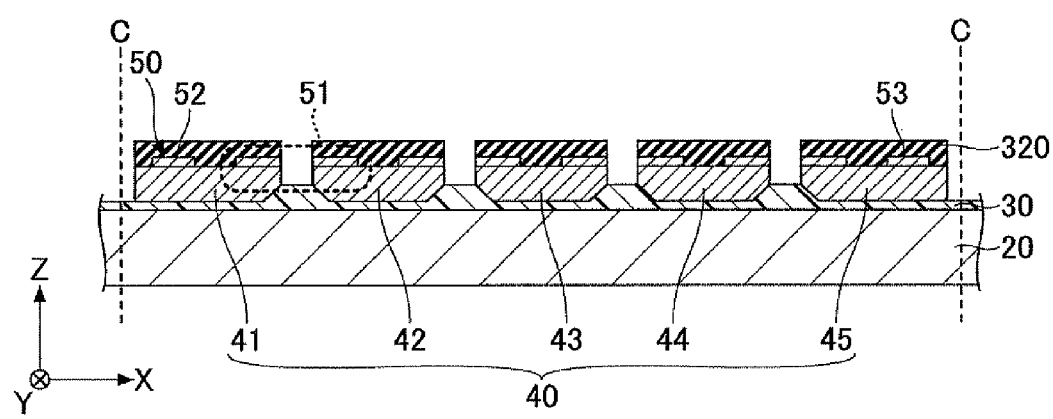
FIG. 29 further illustrates the process of manufacturing the light-emitting element mounting package of the second embodiment.

Referring to FIG. 29, parts of the metallic foil 200 which are not covered by the resist layer 320 are etched thereby forming the wiring portions 41 to 45 of the light-emitting element mounting portion 40 in a manner similar to the process illustrated in FIG. 15. In a case where the metallic foil 200 is made of a copper foil, the metallic foil 200 can be etched using, for example, aqueous ferric chloride, aqueous copper chloride, aqueous ammonium persulfate, or the like.

Figure 30:
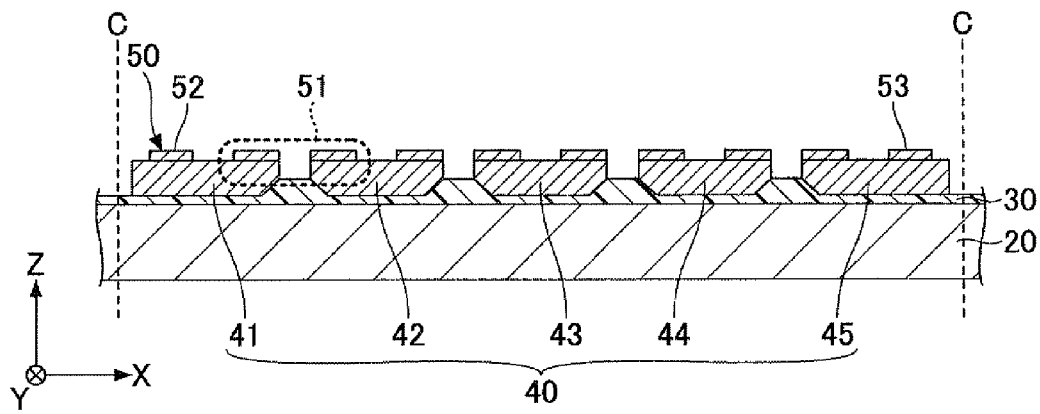
FIG. 30 further illustrates the process of manufacturing the light-emitting element mounting package of the second embodiment.
Figure 31:
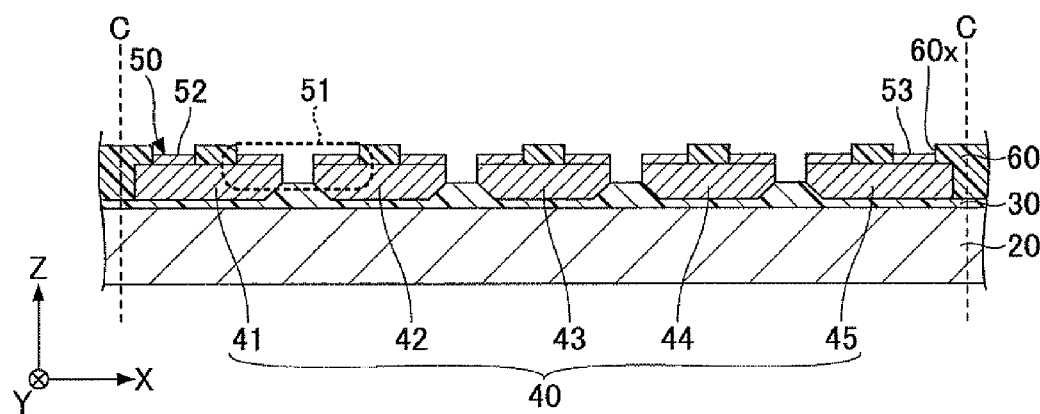
FIG. 31 further illustrates the process of manufacturing the light-emitting element mounting package of the second embodiment.
Figure 32A:
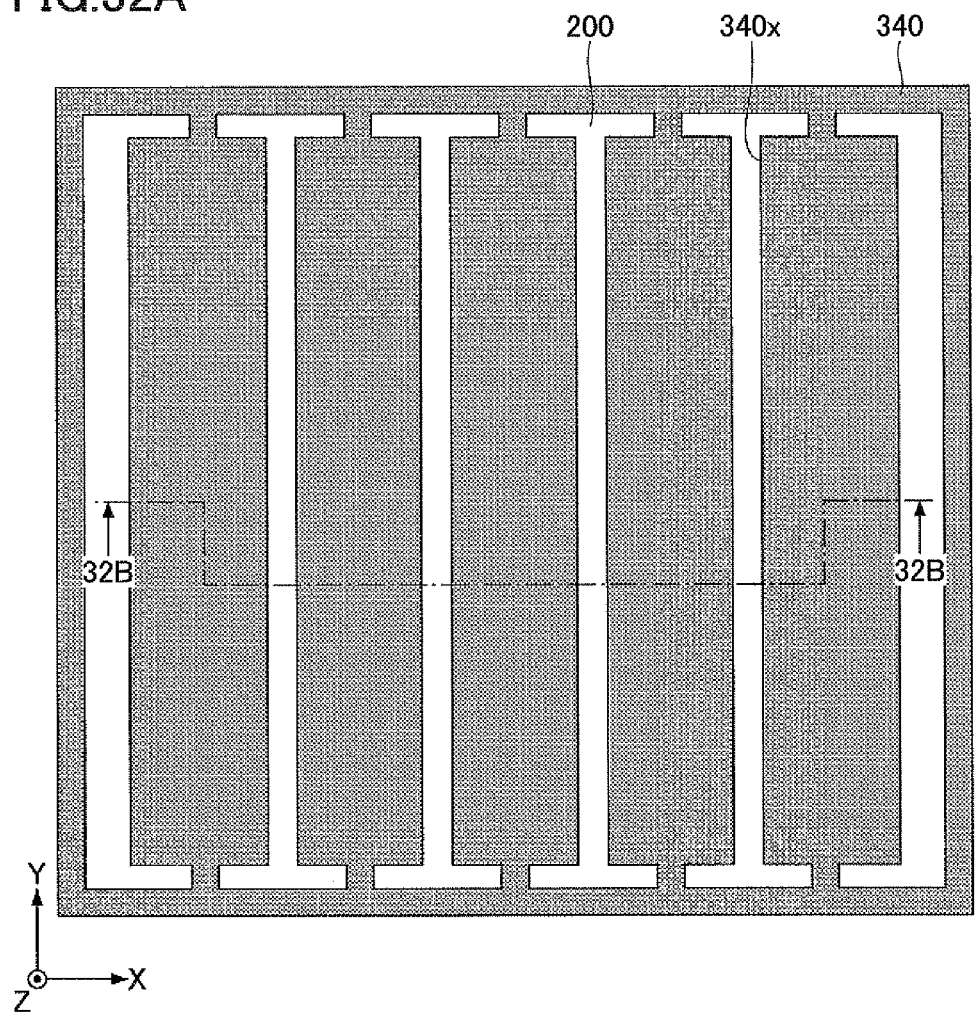
FIG. 32A further illustrates a process of manufacturing the light-emitting element mounting package of the third embodiment.
Figure 32B:
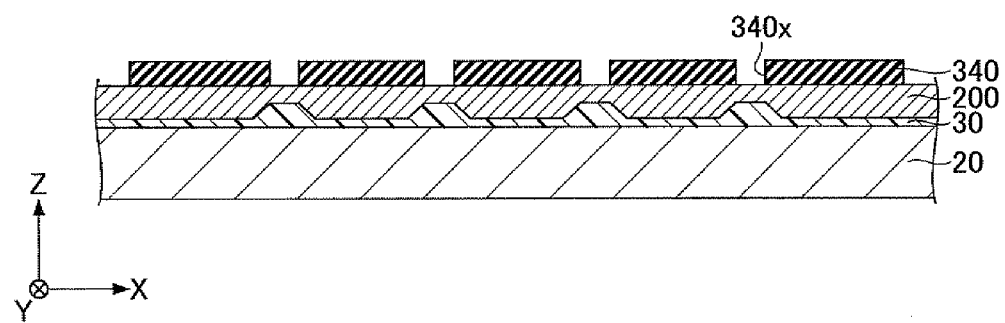
FIG. 32B illustrates a cross-sectional view of the light-emitting element mounting package illustrated in FIG. 32A taken along a line 32B-32B.

Referring to FIG. 30, the resist film 320 illustrated in FIG. 29 is removed. Referring to FIG. 31, in a manner similar to the processes illustrated in FIGS. 17A and 173, the reflective film 60 having opening portions 60x is formed on the insulating layer 30 so as to cover parts of the insulating layer 30 and the light-emitting element mounting portion 40 where the plating film 50 is not formed. The reflective film may be formed to cover outer peripheral portions of the plating film 50. After the process illustrated in FIG. 31, by cutting the structure illustrated in FIG. 31 along the cut lines C in a manner similar to the process illustrated in FIG. 19, plural light-emitting element mounting packages 10 can be completed.

As described above, the plating film 50 may be formed after forming the wiring portions 41 to 45. Alternatively, the plating film 50 is formed on the predetermined area of the metallic foil 200 and thereafter the parts of the metallic foil 200 where the grooves 200x are formed are removed thereby forming the wiring portions 41 to 45.

[c] Third Embodiment

Within the third embodiment, an exemplary manufacturing method of a light-emitting element mounting package different from the first embodiment is exemplified. In the third embodiment, explanation of constructional elements the same as those described in the above embodiments is omitted.

FIGS. 32A to 38B illustrate manufacturing processes of the light-emitting element mounting package of the third embodiment. The processes of the first embodiment illustrated in FIGS. 6 to 13 are performed. Thereafter, in the process illustrated in FIGS. 32A and 32B, a resist layer 340 is formed on the upper surface of the metallic foil 200. The resist layer 340 may be formed in a manner similar to the process of forming the resist layer 300 illustrated in FIG. 8. The resist layer 340 is formed on an area corresponding to wiring portions 41 to 45 of light-emitting element mounting portions 40 and areas corresponding to a frame portion 210 described below and connecting portions 220 described below.

Figure 33A:
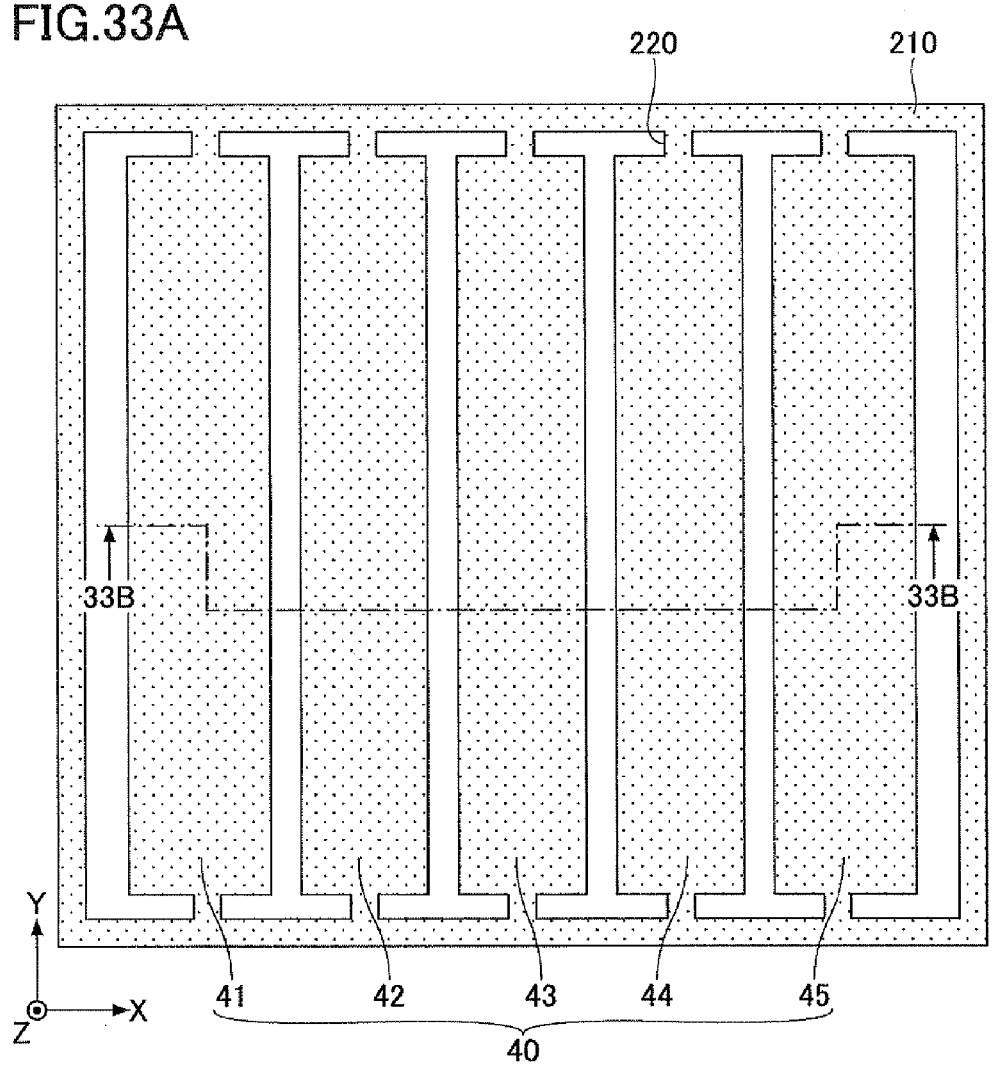
FIG. 33A further illustrates the process of manufacturing the light-emitting element mounting package of the third embodiment.
Figure 33B:
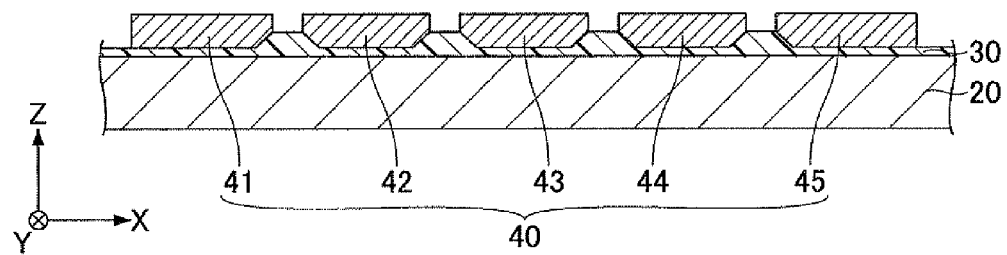
FIG. 33B illustrates a cross-sectional view of the light-emitting element mounting package illustrated in FIG. 33A taken along a line 33B-33B.

Referring to FIGS. 33A and 33B, the metallic foil 200 exposed through opening portions 340x is removed and thereafter the resist layer 340 is removed. In a case where the metallic foil 200 is made of a copper foil, the metallic foil 200 can be removed by wet etching using, for example, aqueous ferric chloride, aqueous copper chloride, aqueous ammonium persulfate, or the like. Thus, wiring portions 41 to 45 of the light-emitting element mounting portion 40 are connected to the frame portion 210 via the connecting portions 220. The frame portion 210 and the connecting portions 220 function as a bus line used in electroplating the wiring portions 41 to 45.

Figure 34A:
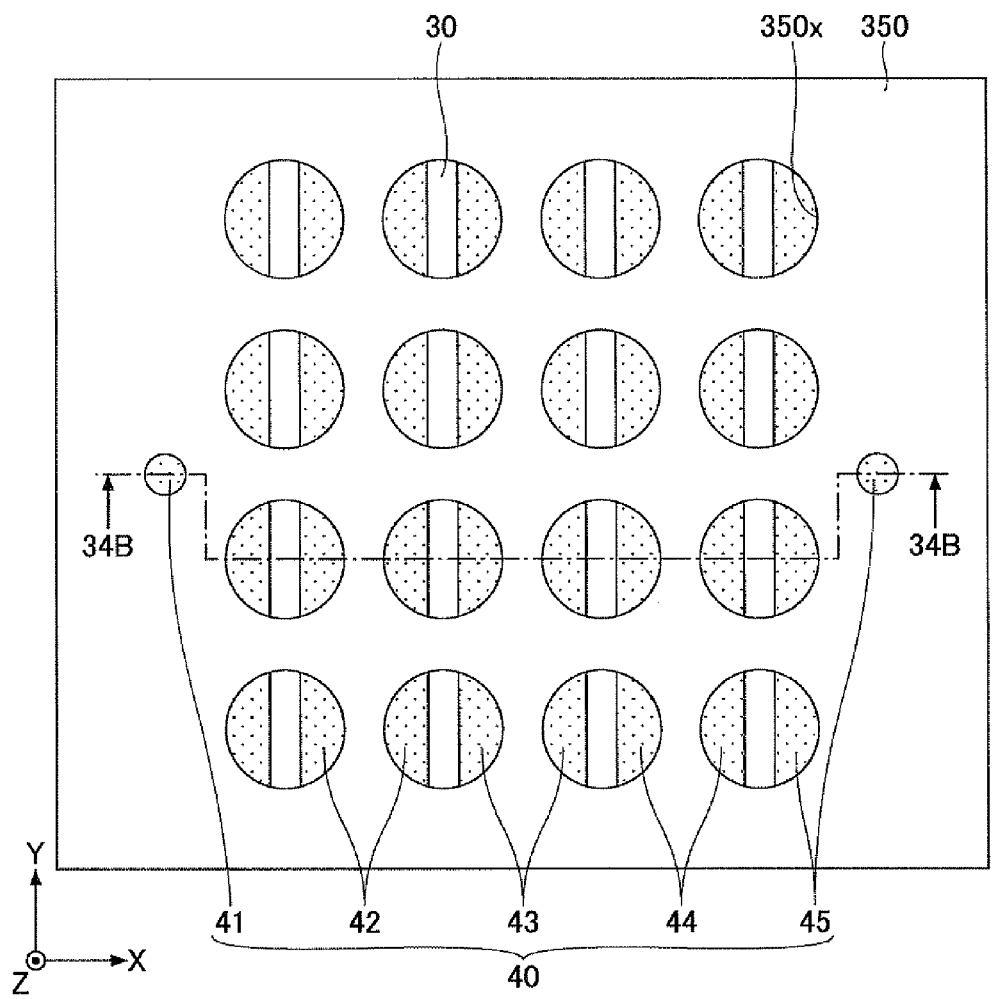
FIG. 34A further illustrates the process of manufacturing the light-emitting element mounting package of the third embodiment.
Figure 34B:
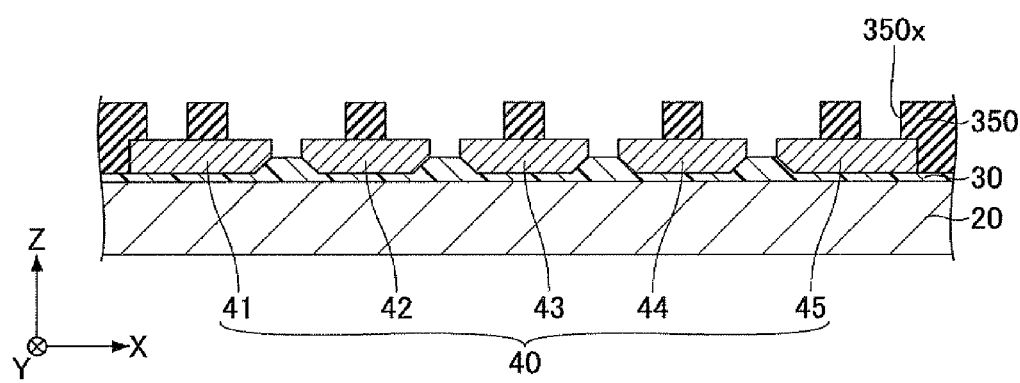
FIG. 34B illustrates a cross-sectional view of the light-emitting element mounting package illustrated in FIG. 34A taken along a line 34B-34B.

Referring to FIGS. 34A and 34B, a resist layer 350 having opening portion 350x corresponding to the plating film 50 is formed. The resist layer 350 may be formed in a manner similar to the process of forming the resist layer 300 or the like illustrated in FIG. 8.

Figure 35A:
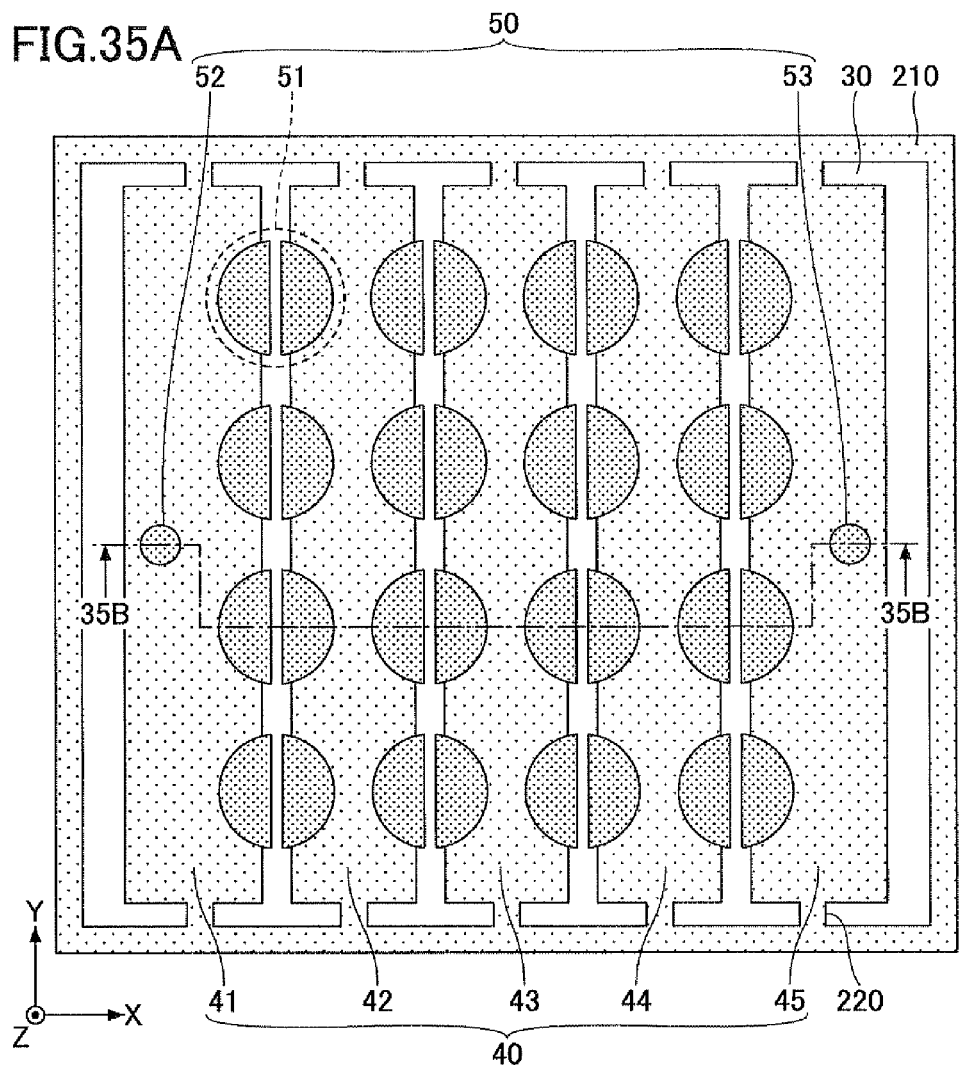
FIG. 35A further illustrates the process of manufacturing the light-emitting element mounting package of the third embodiment.
Figure 35B:
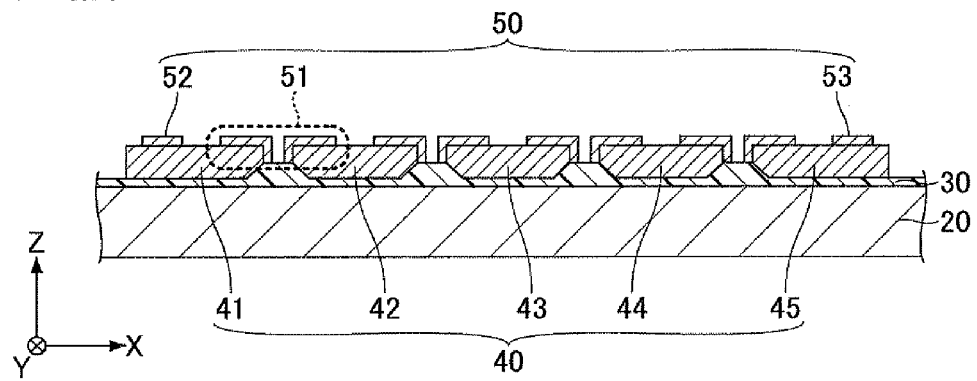
FIG. 35B illustrates a cross-sectional view of the light-emitting element mounting package illustrated in FIG. 35A taken along a line 35B-35B.

Referring to FIGS. 35A and 35B, the plating film 50 is formed inside the opening portions 350x and on the upper surfaces of the wiring portions 41 to 45 of the light-emitting element mounting portion 40 by electroplating using the frame portion 210 and the connecting portions 220 (the frame portion 210 and the connecting portions 220 form a bus line). Thereafter, the resist film 350 is removed.

Figure 36A:
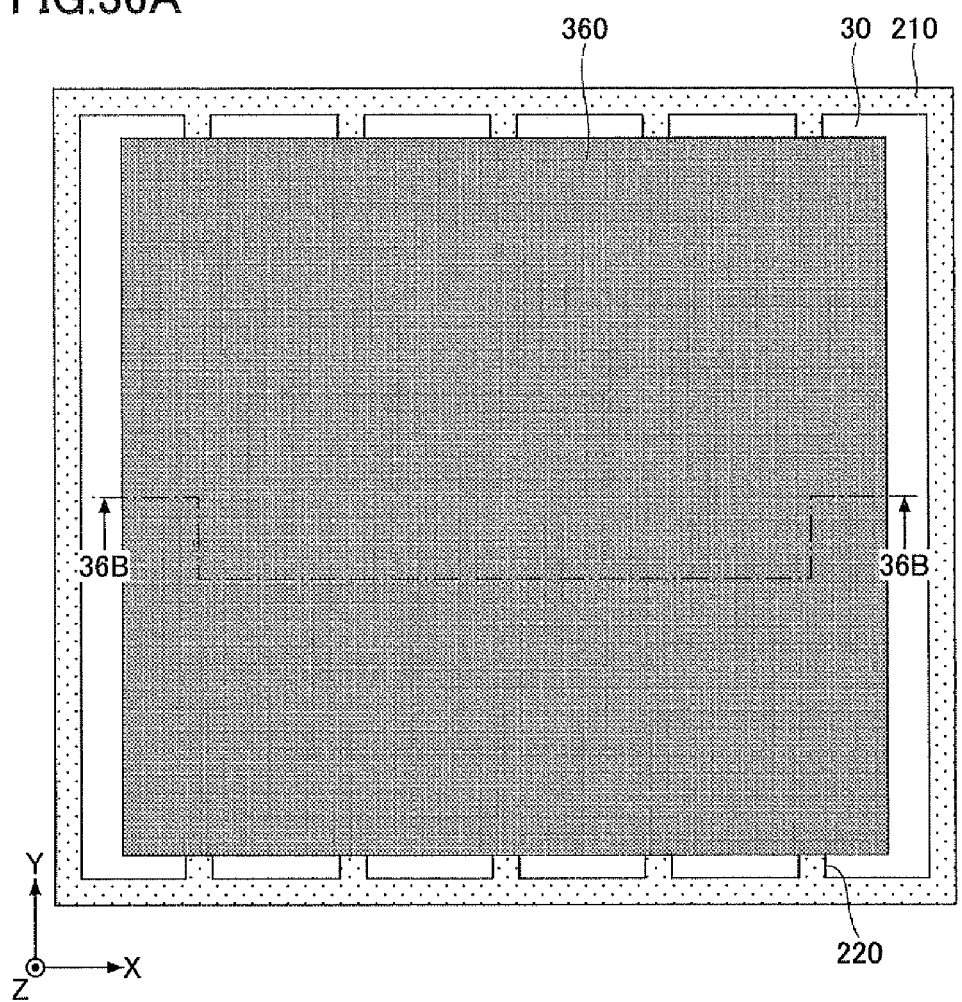
FIG. 36A further illustrates the process of manufacturing the light-emitting element mounting package of the third embodiment.
Figure 36B:
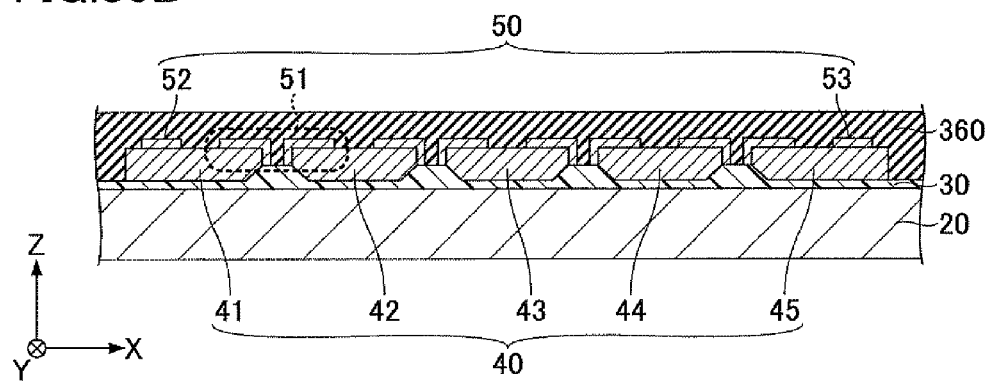
FIG. 36B illustrates a cross-sectional view of the light-emitting element mounting package illustrated in FIG. 36A taken along a line 36B-36B.
Figure 37A:
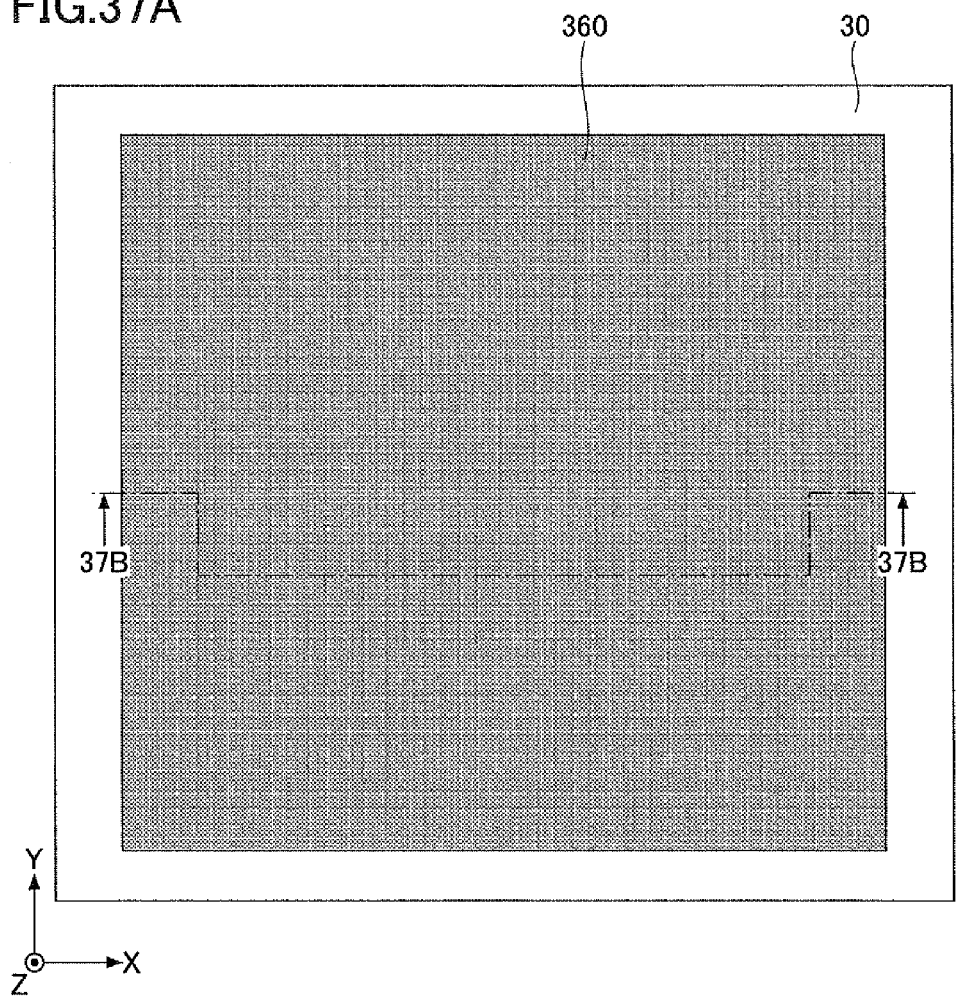
FIG. 37A further illustrates the process of manufacturing the light-emitting element mounting package of the third embodiment.
Figure 37B:
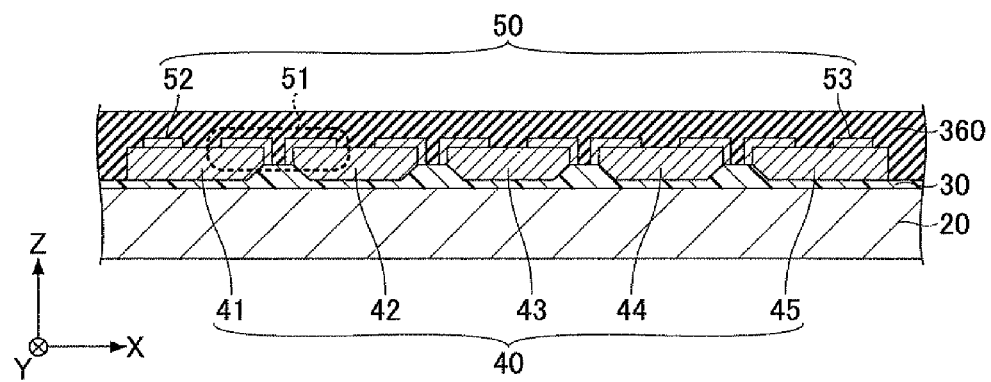
FIG. 37B illustrates a cross-sectional view of the light-emitting element mounting package illustrated in FIG. 37A taken along a line 37B-37B.

Next, referring to FIGS. 36A and 36B, a resist layer 360 is formed on the wiring portions 41 to 45 of the light-emitting element mounting portion 40 and the insulating layer 30 between the adjacent wiring portions 41 to 45. The resist layer 360 may be formed in a manner similar to the process of forming the resist layer 300 or the like illustrated in FIG. 8. Next, referring to FIGS. 37A and 37B, the bus line including the frame portion 210 and the connecting portions 220 are removed. In a case where the frame portion 210 and the connecting portions 220 are made of a copper foil, the frame portion 210 and the connecting portions 220 can be removed by wet etching using, for example, aqueous ferric chloride, aqueous copper chloride, aqueous ammonium persulfate, or the like.

Figure 38A:
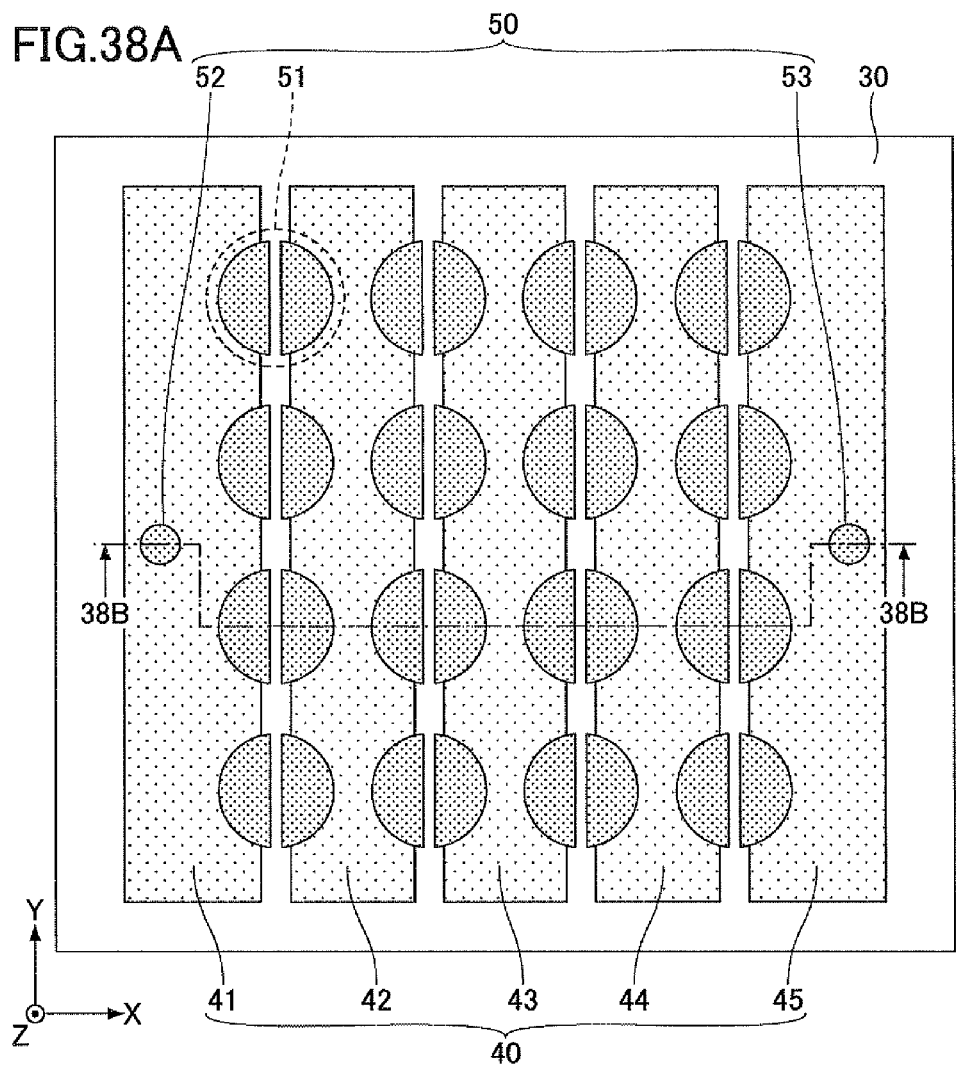
FIG. 38A further illustrates the process of manufacturing the light-emitting element mounting package of the third embodiment.
Figure 38B:
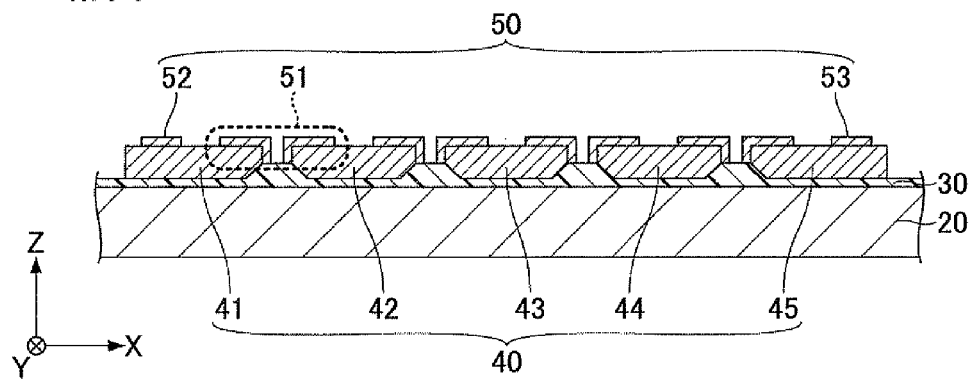
FIG. 38B illustrates a cross-sectional view of the light-emitting element mounting package illustrated in FIG. 38A taken along a line 38B-38B.

Referring to FIGS. 38A and 38B, the resist film 360 is removed. After the process illustrated in FIGS. 38A and 38B, in a manner similar to the process illustrated in FIGS. 17A and 17B, the reflection film 60 having opening portions 60x is formed on the insulating layer 30 so as to cover the light-emitting element mounting portion 40 and the electro plating film 50. Then, this structure is cut along cut lines C. Thus, the plural light-emitting element mounting packages 10 are completed.

As described, the plating film 50 may be formed by electroless plating or electroplating where the predetermined bus line made of the metallic foil 200 is formed in advance.

Eventually, the light-emitting element mounting package 10 of the third embodiment does not include the bus line in the product form for selling since there is the process of removing the bus line after electoplating the plating film 50. Therefore, end faces of the bus line are not exposed on side faces of the light-emitting element mounting package 10 even after dicing the structure to obtain the light-emitting element mounting package 10. If the end faces of the bus line are exposed on the side surfaces of the light-emitting element mounting packages 10, when the distances between the end faces of the bus line and the side surfaces of the metallic plate are close, a short-circuit between the end faces of the bus line and the side surfaces of the metallic plate may occur with a burr. In the light-emitting element mounting package 10 of the third embodiment, such a problem can be prevented.

[d] Fourth Embodiment

Within the fourth embodiment, an exemplary pattern of arranging the wiring patterns different from the pattern of arranging the wiring patterns in the first embodiment is illustrated. Within the fourth embodiment, explanation of constructional elements the same as those described in the above embodiments is omitted.

Figure 39:
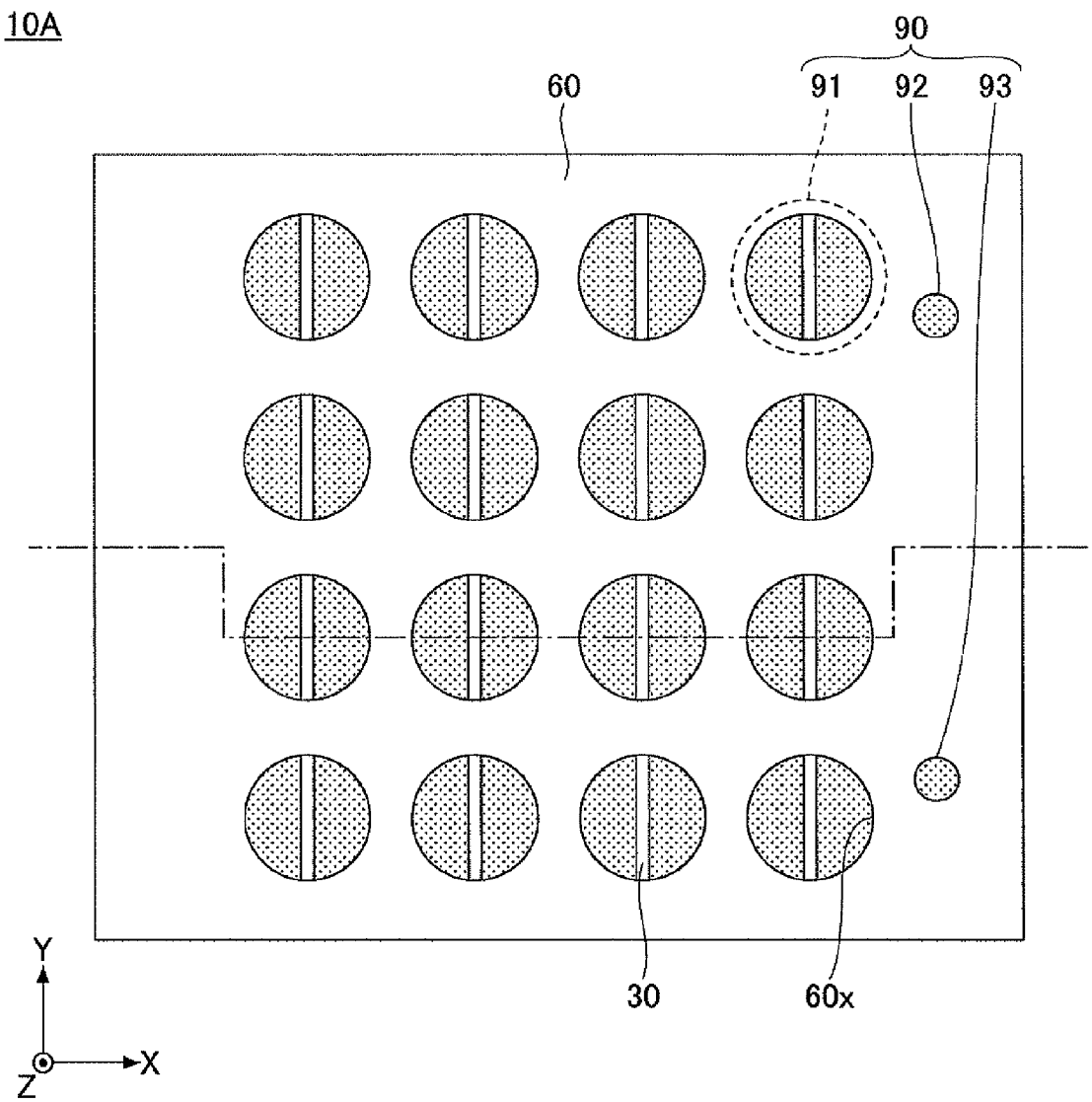
FIG. 39 is a plan view of a light-emitting element mounting package of a fourth embodiment.
Figure 40:
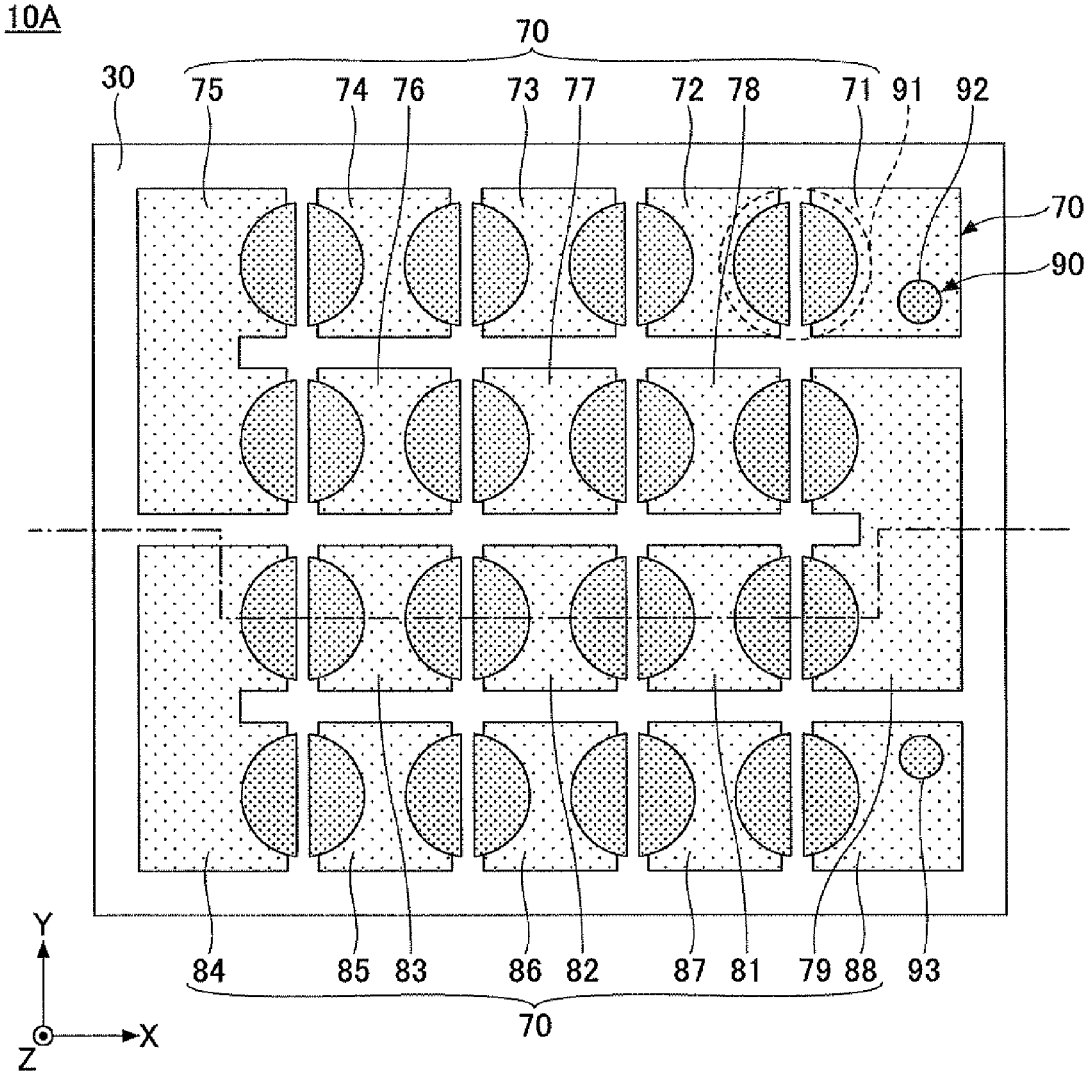
FIG. 40 is another plan view of the light-emitting element mounting package of the fourth embodiment.

FIG. 39 is a plan view of a light-emitting element mounting package 10A of the fourth embodiment. FIG. 40 is another plan view of the light-emitting element mounting package 10A of the fourth embodiment. In FIG. 40, the reflective film 60 illustrated in FIG. 39 is omitted.

Referring to FIGS. 39 and 40, in the light-emitting element mounting package 10A, a light-emitting element mounting portion 70 includes wiring portions 71 to 88 which are electrically insulated from one another. Although it is not specifically illustrated, the light-emitting element mounting portion 70 is formed on the insulating layer 30 so that the light-emitting element mounting portion 70 is embedded into the insulating layer 30. However, a part including the upper surface of the light-emitting element mounting portion 70 (the upper surfaces of the wiring portions 71 to 88) is exposed on the insulating layer 30.

Although it is not specifically illustrated, in a manner similar to the wiring portions 71 to 88, cutout portions are formed on (under) lower sides (facing the insulating layer 30) in side edge portions that face each other and belong to the wiring portions 71 to 88 adjacent in the X directions, respectively. The thicknesses of the adjacent wiring portions 71 to 88 in the cutout portions are less than the thicknesses of the adjacent wiring portions 71 to 88 in the part other than the cutout portions. The cutout portions of the wiring layers 71 to 88 are covered by the insulating layer 30. The parts other than the cutout portions of the wiring layers 71 to 88 in the side edge portions protrudes from the insulating layer 30 so as to be positioned higher than the insulating layer 30. The cross-sectional shapes of the cutout portions may be, for example, rounded concavities or the like.

The wiring portions 71 to 88 are shaped like rectangles in their plan views. The wiring portions 71 to 88 are arranged so that predetermined gaps are interposed between sides of adjacent wiring portions that face each other and arranged in parallel in the Y directions. However, the lengths of the wiring portions 75, 79 and 84 in the Y directions are longer than the lengths of the other wiring portions. For example, the lengths of the wiring portions 75, 79 and 84 are about twice as long as the lengths of the other wiring portions.

The wiring portions 71 to 74 and a part of the wiring portion 75 are arranged in this order in the minus X direction while interposing predetermined gaps between the wiring portions 71 to 75. The other part of the wiring portion 75, the wiring portions 76 to 78, and a part of the wiring portion 79 are arranged in this order in the plus X direction while interposing predetermined gaps between the wiring portions 75 to 79. The other part of the wiring portion 79, the wiring portions 81 to 83, and a part of the wiring portion 84 are arranged in this order in the minus X direction while interposing predetermined gaps between the wiring portions 79 and 81 to 84. The other part of the wiring portion 84 and the wiring portions 85 to 88 are arranged in this order in the plus X direction while interposing predetermined gaps between the wiring portions 84 to 88. Said differently, the wiring portions 71 to 79 and 81 to 88 are arranged in a shape of rectangular wave bending at the wiring portions 75, 79 and 84 in their plan views.

In the wiring portions 71 to 88 other than the wiring portions 75, 79, and 84, the lengths of the sides parallel to the X directions may be, for example, about 1 mm to about 5 mm, and the lengths of the sides parallel to the Y directions may be, for example, about 1 mm to about 5 mm. In the wiring portions 75, 79, and 84, the lengths of the sides parallel to the X directions may be, for example, about 1 mm to about 5 mm. The lengths of the sides parallel to the Y directions may be, for example, about 2 mm to about 10 mm. In the wiring portions 71 to 88, gaps between the adjacent wiring portions along the X directions may be, for example, about 50 μm to about 100 μm.

The plating film 90 is formed on predetermined areas of the wiring portions 71 to 88. The object of forming the plating film 90 is to improve reliability in connecting members or the like to be connected to the wiring portions 71 to 88. The material and thickness of the plating film 90 are similar to those of the plating film 50.

Light-emitting element mounting areas 91 are formed by adjacent wiring portions of the plating film 90. For example, the light-emitting element mounting areas 91 are formed by plating films, which are shaped like semicircles in their plan views. The plating films respectively face corresponding wiring portions. One light-emitting element having two terminals may be installed in the light-emitting element mounting area 91. However, one light-emitting element having four terminals or the like may be installed in the light-emitting element mounting area 91.

On the wiring portion 71, a first electrode 92 made of the plating film 90 is formed. The first electrode 92 is electrically connected to the part of the light-emitting element mounting area 91 formed on the wiring portion 71. On the wiring portion 88, a second electrode 93 made of the plating film 90 is formed. The second electrode 93 is electrically connected to the part of the light-emitting element mounting area 91 formed on the wiring portion 88. The first electrode 92 and the second electrode 93 are connected to, for example, a power source, a driving circuit, or the like, which is arranged outside the light-emitting element mounting package 10A.

As described, the wiring portions 71 to 88 of the light-emitting element mounting portion 70 are arranged in a rectangular wave shape bending at the wiring portions 75, 79, and 84. The light-emitting element mounting areas 91 are formed between corresponding adjacent wiring portions. The first electrode 92 and the second electrode 93 are formed on wiring portions 71 and 88 on both of the ends of the wiring portions arranged in the rectangular wave shape, respectively. Therefore, the light-emitting elements can be mounted in series on the light-emitting element mounting areas 91 between the first electrode 92 and the second electrode 93.

The light-emitting element mounting packages 10A can be manufactured by processes similar to those in the first through third embodiments.

As described, in the light-emitting element mounting package 10 or 10A, the light-emitting element mounting portion 40 or 70 may be mounted in series and parallel as in the first embodiment or in series as in the fourth embodiment.

[e] Fifth Embodiment

Within the fifth embodiment, an exemplary light-emitting element package different from that of the first embodiment is described. Within the fifth embodiment, explanation of constructional elements the same as those described in the above description is omitted.

[Structure of Light-Emitting Element Mounting Package of the Fifth Embodiment]

Figure 41A:
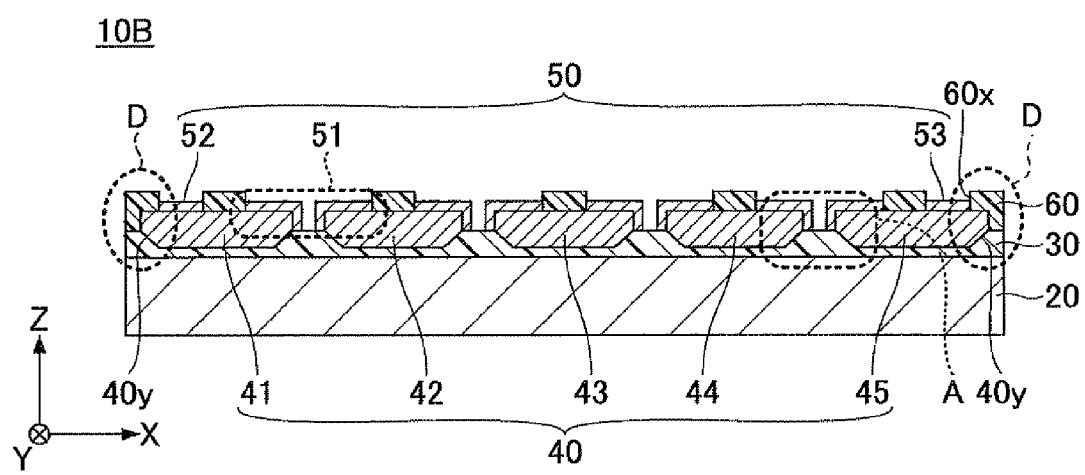
FIG. 41A is a cross-sectional view of a light-emitting element mounting package of the fifth embodiment.
Figure 41B:
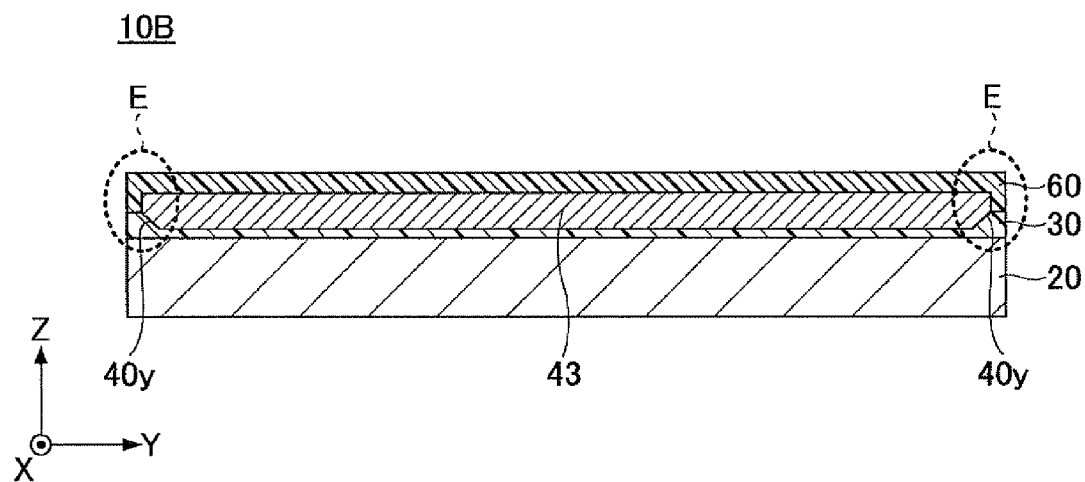
FIG. 41B is another cross-sectional view of the light-emitting element mounting package of a fifth embodiment.

The structure of a light-emitting element mounting package of the fifth embodiment is described. FIGS. 41A and 41B are cross-sectional views of the light-emitting element mounting package corresponding to the cross-sectional view illustrated in FIGS. 3A and 3B of the first embodiment, respectively. Because the plan view of the light-emitting element mounting package of the fifth embodiment is similar to the plan views in FIGS. 1 and 2, the plan view of the light-emitting element mounting package of the fifth embodiment is omitted.

Within the first embodiment, the cutout portions 40y are formed on (under) the lower sides (facing the insulating layer 30) in side edge portions 40x that face each other and belong to adjacent wiring portions 41 to 45, respectively. Said differently, referring to FIGS. 3A and 4, the cutout portions 40y are not formed on the side edge portions 40x which belong to the wiring portions 41 and 45 and do not face the other wiring portions 42 and 44, respectively. Referring to FIG. 3B, the cutout portions 40y are not formed on both of the ends of the wiring portions 41 to 45.

Meanwhile, referring to FIGS. 41A and 41B, cutout portions 40y are formed on (under) the lower sides (facing the insulating layer 30) in side edge portions 40x that face each other and respectively belong to adjacent wiring portions 41 to 45. The cutout portions 40y are also formed on the side edge portions 40x (region D) which belong to the wiring portions 41 and 45 and do not face the other wiring portions 42 and 44. The cutout portions 40y are also formed on both ends (region E) of the wiring portions 41 to 45 in the longitudinal directions of the wiring portions 41 to 45. The cutout portions 40y including those in the regions D and E are covered by the insulating layer 30. The parts of the wiring layers 41 to 45 upper than the cutout portions 40y protrude from the insulating layer 30 so as to be positioned higher than the insulating layer 30. The shape of the cutout portions 40y in the regions D and E is similar to the shape of the cutout portions 40y formed in the side edge portions 40x illustrated in FIG. 4.

As described, the features of the fifth embodiment are that the cutout portions 40y are also formed on the side edge portions 40x (the region D) which belong to the wiring portions 41 and 45 and do not face the other wiring portions 42 and 44 and both of the ends (the region E) of the wiring portions 41 to 45 in the longitudinal directions of the wiring portions 41 to 45. Effects of the fifth embodiment are described in a method of manufacturing the light-emitting element mounting package as follows.

[Method of Manufacturing Light-Emitting Element Mounting Package of the Fifth Embodiment]

The method of manufacturing the light-emitting element mounting package of the fifth embodiment is described. FIGS. 42 to 54 illustrate manufacturing processes of the light emitting element mounting package of the fifth embodiment.

Figure 42:
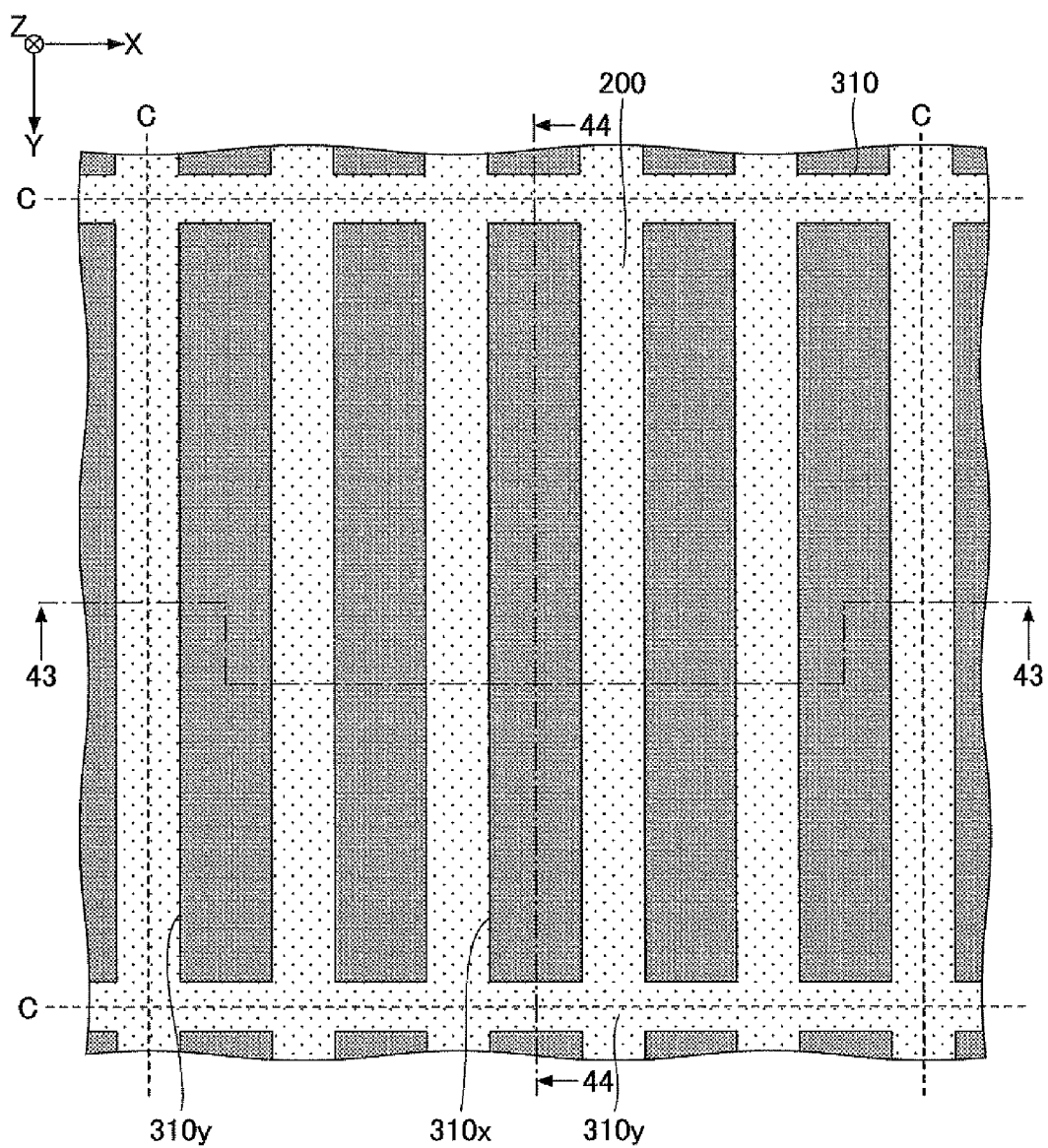
FIG. 42 illustrates a process manufacturing of the light-emitting element mounting package of the fifth embodiment.
Figure 43:
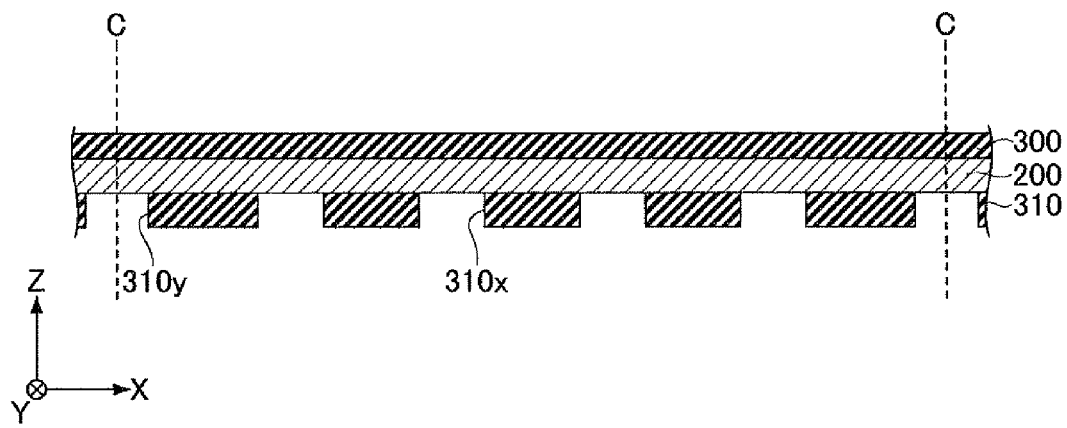
FIG. 43 further illustrates the process of manufacturing the light-emitting element mounting package of the fifth embodiment.
Figure 44:
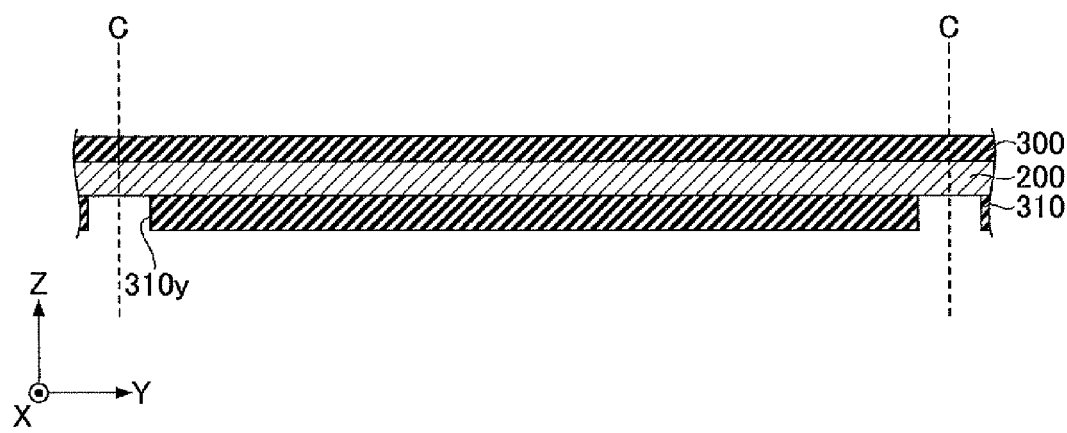
FIG. 44 further illustrates the process of manufacturing the light-emitting element mounting package of the fifth embodiment.

At first, the processes similar to those illustrated in FIGS. 6 and 7 of the first embodiment are performed. Referring to FIGS. 42 to 44, the resist layer 300 covering the upper surface of the metallic foil 200 in its entirety is formed, and a resist layer 310 having opening portions 310x, through which parts of the lower surfaces of the metallic foil 200 are exposed, is formed below the lower surface of the metallic foil 200.

Referring to FIGS. 42 to 44, the opening portions 310x are formed at positions corresponding to the gaps between the adjacent wiring portions 41 to 45. Meanwhile, opening portions 310y are formed on the side edge portions 40x (the region D) which belong to the wiring portions 41 and 45 and do not face the other wiring portions 42 and 44 and both of the ends (the region E) of the wiring portions 41 to 45 in the longitudinal directions of the wiring portions 41 to 45. The material of the resist layers 300 and 310 is similar to the material of the resist layer 300 or the like illustrated in FIG. 8. The resist layers 300 and 310 may be formed in a manner similar to the process of forming the resist layer 300 or the like illustrated in FIG. 8. FIG. 42 is a bottom view of the metallic foil 200. FIG. 43 is a cross-sectional view taken along a line 43-43 in FIG. 42. FIG. 44 is a cross-sectional view taken along a line 44-44 in FIG. 42.

Figure 45:
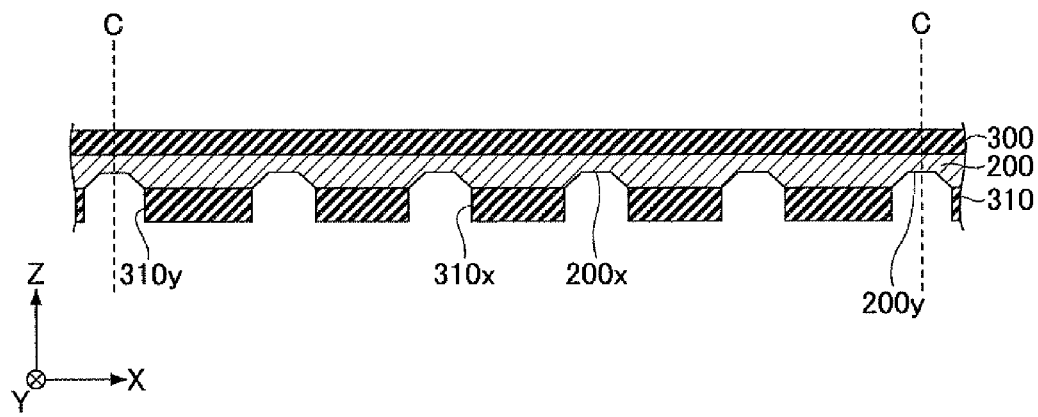
FIG. 45 further illustrates the process of manufacturing the light-emitting element mounting package of the fifth embodiment.
Figure 46:
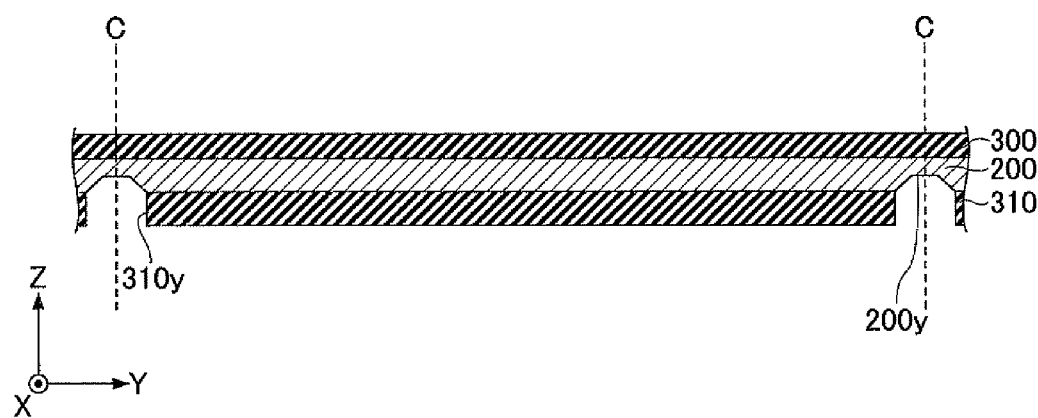
FIG. 46 further illustrates the process of manufacturing the light-emitting element mounting package of the fifth embodiment.

Next, referring to FIGS. 45 and 46, the grooves 200x are formed by half etching the parts of the metallic foil 200 exposed through the opening portions 310x. Further, grooves 200y are formed by half etching parts of the metallic foil 200 exposed through the opening portions 310y of the resist layer 310. The grooves 200x and 200y may be formed in a manner similar to the process of forming the grooves 200x illustrated in FIGS. 9 to 11B. FIG. 45 is a cross-sectional view corresponding to FIG. 43. FIG. 46 is a cross-sectional view corresponding to FIG. 44.

Figure 47:
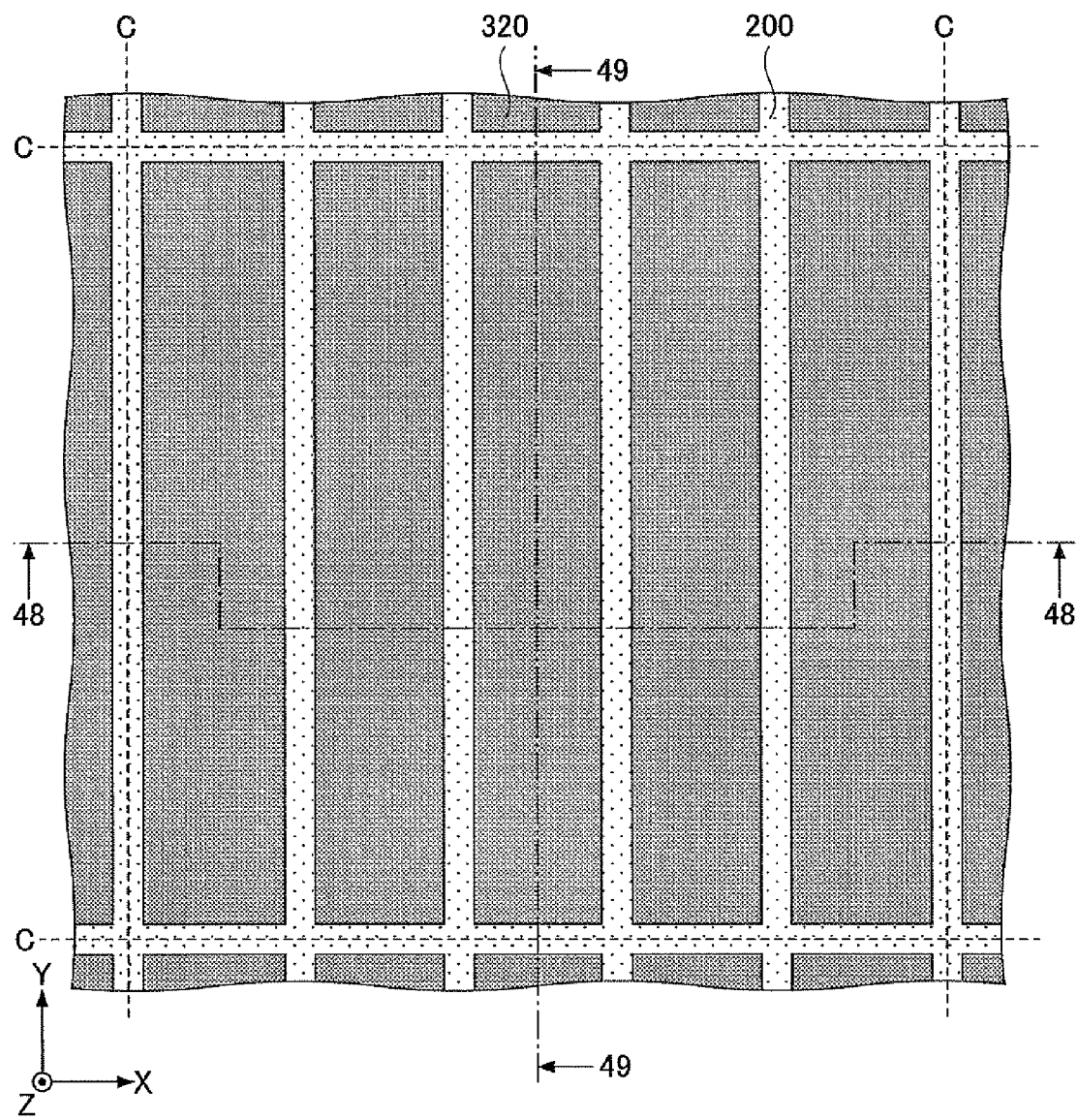
FIG. 47 further illustrates the process of manufacturing the light-emitting element mounting package of the fifth embodiment.
Figure 48:
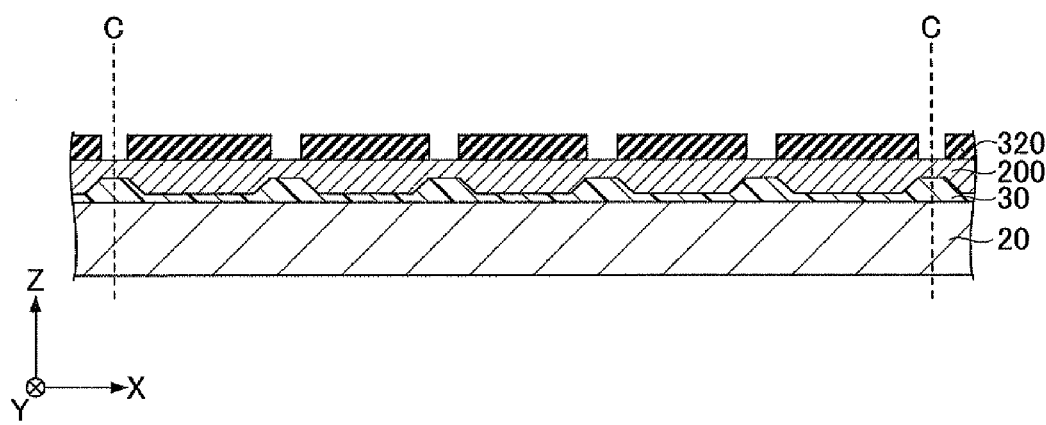
FIG. 48 further illustrates the process of manufacturing the light-emitting element mounting package of the fifth embodiment.
Figure 49:
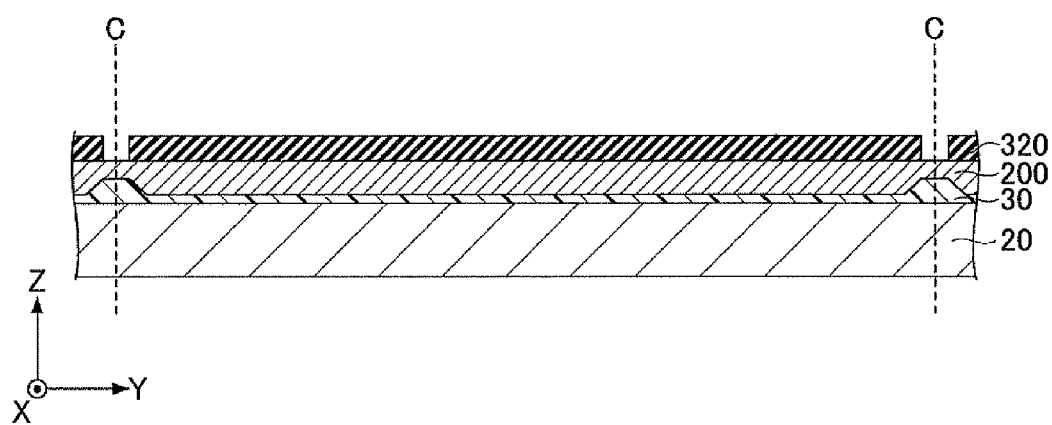
FIG. 49 further illustrates the process of manufacturing the light-emitting element mounting package of the fifth embodiment.

After performing the processes similar to those illustrated in FIGS. 12 and 13, the resist layer 320 is formed on the upper surfaces of the metallic foil 200 in the processes illustrated in FIGS. 47 to 49. The resist layer 320 is formed to cover parts corresponding to the wiring portions 41 to 45 of the light-emitting element mounting portion 40. At this time, parts of the upper surfaces of the wiring portions above the cutout portions 40x are also covered. The resist layers 320 may be formed with a process similar to the process of forming the resist layers 300 and 310 illustrated in, for example, FIG. 8. FIG. 47 is a top view of the light emitting element mounting package. FIG. 48 is a cross-sectional view taken along a line 48-48 in FIG. 47. FIG. 49 is a cross-sectional view taken along a line 49-49 in FIG. 47.

Figure 50:
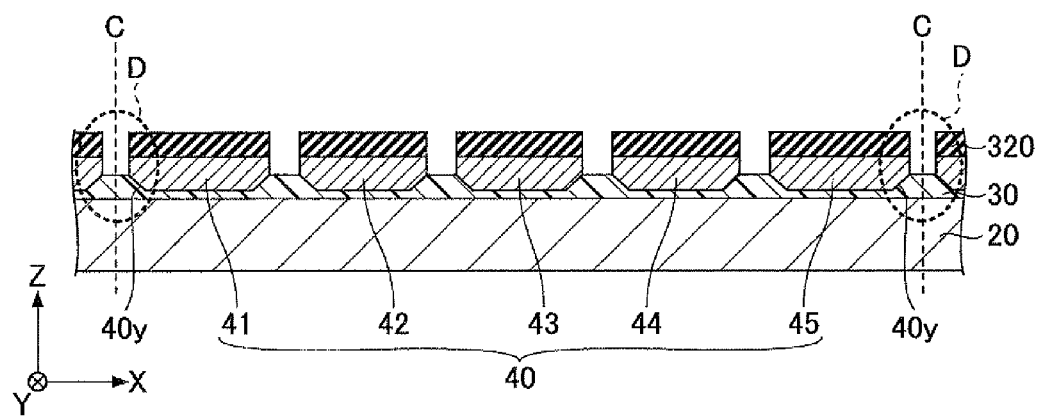
FIG. 50 further illustrates the process of manufacturing the light-emitting element mounting package of the fifth embodiment.
Figure 51:
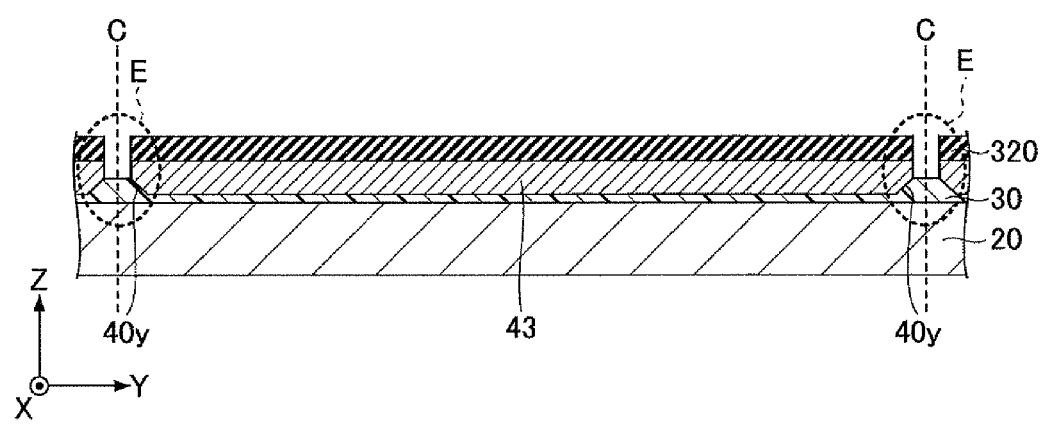
FIG. 51 further illustrates the process of manufacturing the light-emitting element mounting package of the fifth embodiment.

Next, referring to FIGS. 50 and 51, in a manner similar to the process of FIG. 15, the parts of the metallic foil 200 which are not covered by the resist layer 320 are removed by etching. Thus, the light-emitting element mounting portion 40 in which the wiring portions 41 to 45 are arranged while interposing predetermined gaps between the wiring portions 41 to 45 is formed. In this process, the cutout portions 40y are formed of the inner walls of the groove 200x on (under) the lower side of the side edge portions 40x of the adjacent wiring portions which face each other.

As described, the cutout portions 40y are also formed on the side edge portions 40x (the region D) which belong to the wiring portions 41 and 45 and do not face the other wiring portions 42 and 44 and both of the ends (the region E) of the wiring portions 41 to 45 in the longitudinal directions of the wiring portions 41 to 45. The cutout portions 40y including those in the regions D and E are covered by the insulating layer 30. The parts of the wiring layers 41 to 45 upper than the cutout portions 40y protrude from the insulating layer 30 so as to be positioned higher than the insulating layer 30. FIG. 50 is a cross-sectional view corresponding to FIG. 48. FIG. 51 is a cross-sectional view corresponding to FIG. 49.

Figure 52:
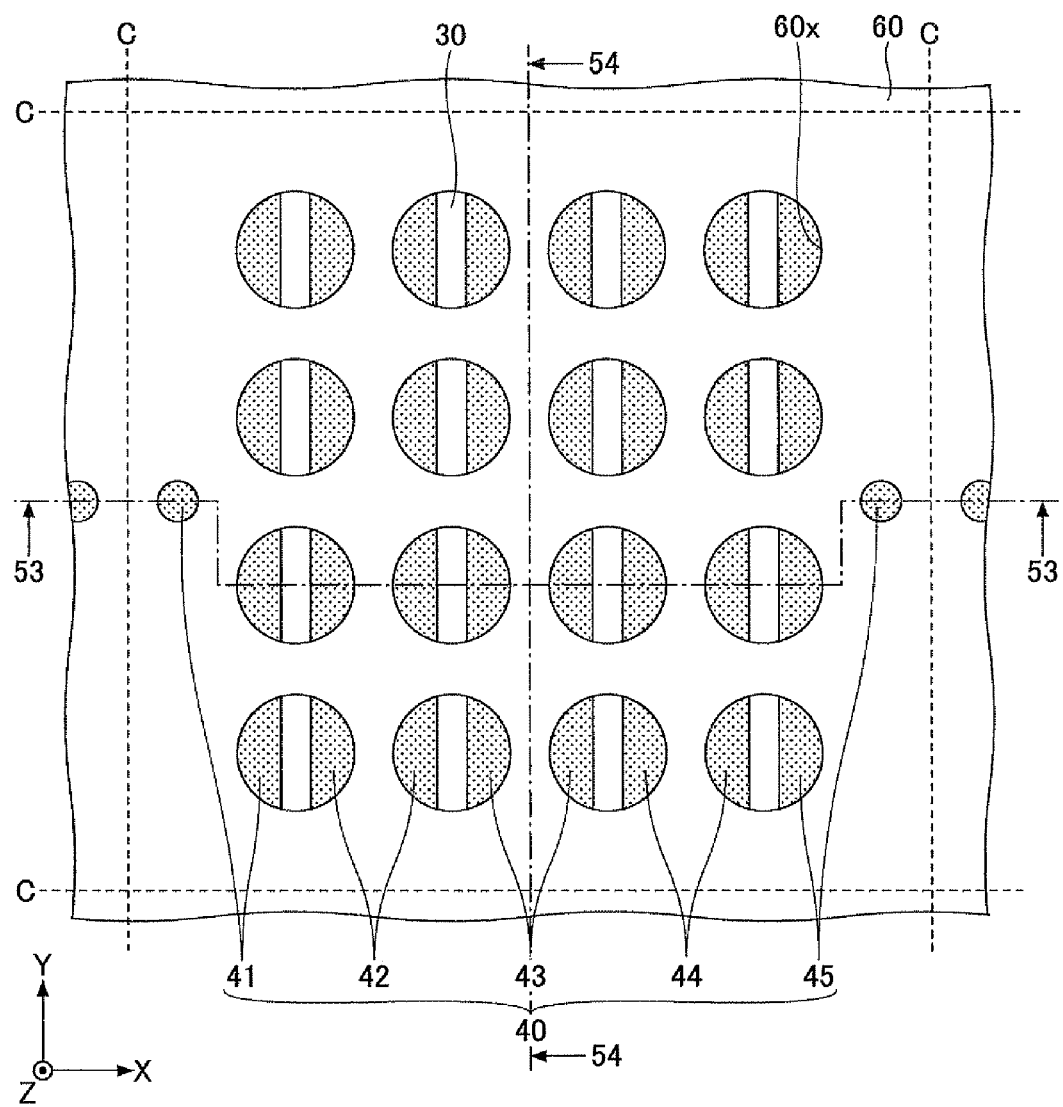
FIG. 52 further illustrates the process of manufacturing the light-emitting element mounting package of the fifth embodiment.
Figure 53:
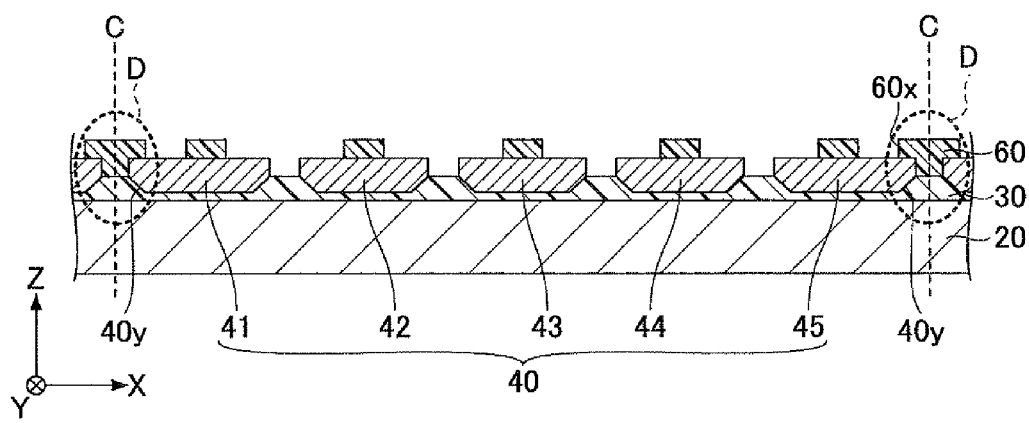
FIG. 53 further illustrates the process of manufacturing the light-emitting element mounting package of the fifth embodiment.
Figure 54:
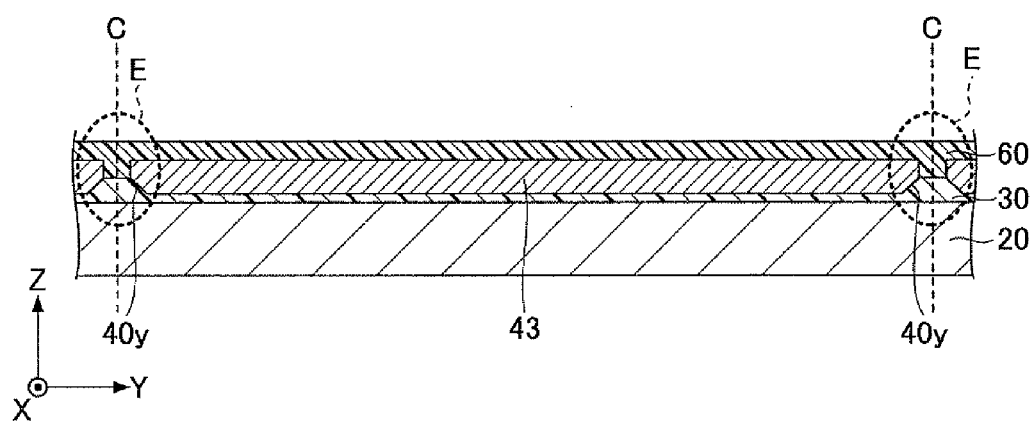
FIG. 54 further illustrates the process of manufacturing the light-emitting element mounting package of the fifth embodiment.

Next, processes illustrated in FIGS. 52 to 54 are described. After removing the resist layer 320 illustrated in FIGS. 50 and 51, in a manner similar to the processes illustrated in FIGS. 17A and 17B, the reflective film 60 having the opening portions 60x is formed so as to cover a part of the insulating layer 30 and a part of the light-emitting element mounting portion 40. Subsequently, the processes similar to those illustrated in FIGS. 18 and 19 of the first embodiment are performed to thereby complete the light-emitting element mounting package 10B illustrated in FIGS. 41A and 41B.

As described, within the fifth embodiment, the cutout portions 40y are also formed in the side edge portions 40x (the region D) which belong to the wiring portions 41 and 45 and do not face the other wiring portions 42 and 44 and both of the ends (the region E) of the wiring portions 41 to 45 in the longitudinal directions of the wiring portions 41 to 45. Therefore, the insulting layer 30 upward protrudes so as to cover the cutout portions 40y in the regions D and E. Then, step-like portions of the reflective film 60 can be made low. Said differently, the step formed between the upper surfaces of the wiring portions 41 and 45 and the upper surface of the insulating layer 30 in the regions D and E is lower than the step formed between the upper surfaces of the wiring portions 41 and 45 and the upper surface of the insulating layer 30 in regions of the light-emitting element mounting package corresponding to the regions D and E.

With this, it becomes easy to form the reflective film 60. Specifically, for example, when the reflective film 60 is formed by printing, the number of printings in the light-emitting element mounting package 10B is less than the number of printings in the light-emitting element mounting package 10. This is because the step formed between the upper surfaces of the wiring portions 41 and 45 and the upper surface of the insulating layer 30 is lower in the light-emitting element mounting package 10B than in the light-emitting element mounting package 10. Further, unevenness in printing the reflective film 60 can be reduced to thereby improve the flatness of the reflective film 60. Further, because the amount of the material of the reflective film 60 can be reduced, the manufacturing cost of the light-emitting element mounting package 10B can be reduced.

Figure 55A:
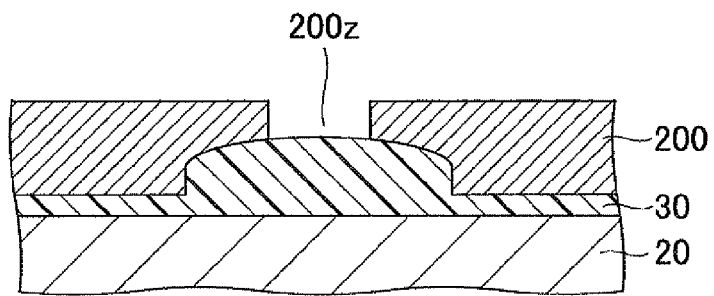
FIG. 55A illustrates a cross-sectional shape of the metallic foil to be removed.
Figure 55B:
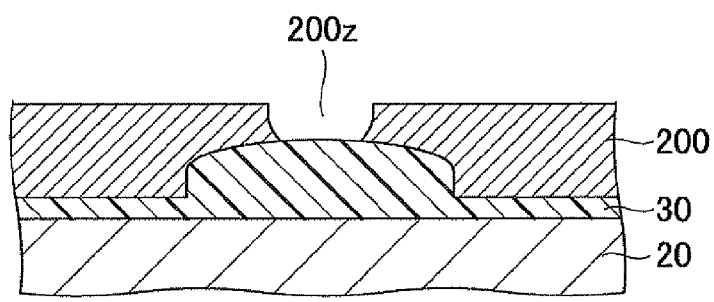
FIG. 55B illustrates another cross-sectional shape of the metallic foil to be removed.
Figure 55C:
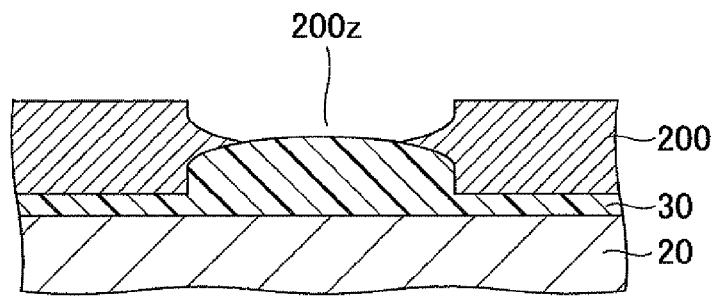
FIG. 55C illustrates another cross-sectional shape of the metallic foil to be removed.

As described, in the processes illustrated in FIGS. 50 and 51, the part of the metallic foil 200 which is not covered by the resist layer 320 is removed by etching. At this time, the cross-sectional view of the metallic foil 200 to be removed may be in a substantially rectangular shape as illustrated in FIG. 55A or in a substantially U-like shape as illustrated in FIG. 55B. Further, as in the regions D and E illustrated in FIGS. 50 and 51 where narrowness of pitches is not sought, the width of the gaps (the width of the U-like shape) in the cross-sectional shape 200z may be increased as illustrated in FIG. 55C.

Figure 55D:
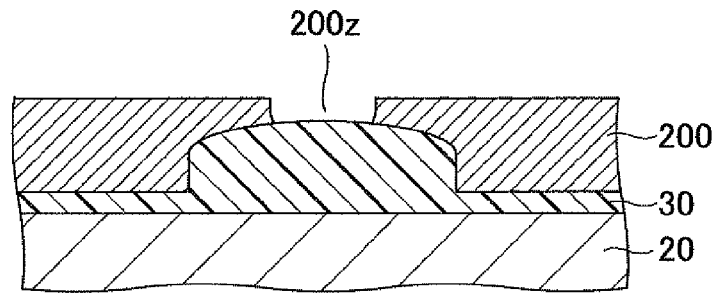
FIG. 55D illustrates another cross-sectional shape of the metallic foil to be removed.

As illustrated in FIG. 55D, the depths of the grooves 200x and 200y may be increased in the processes illustrated in FIGS. 45 and 46. In this case, the thickness of the metallic foil 200 at the part to be removed by etching in the processes illustrated in FIGS. 50 and 51 can be reduced. Therefore, this cross-sectional shape illustrated in FIG. 55D is preferable to narrow the pitch of the wiring portions. Referring to FIG. 55D, the step between the upper surface of the metallic foil 200 and the upper surface of the insulating layer 30 which is not covered by the metallic foil 200 can be further reduced in comparison with the step illustrated in FIGS. 55A to 55C. Therefore, the above effect of reducing the number of printing the reflective film 60 can be further improved.

[f] Sixth Embodiment

Within the sixth embodiment, an exemplary method of manufacturing a light-emitting element mounting package different from that in the first embodiment is described. In the sixth embodiment, explanation of constructional elements the same as those described in the above embodiments is omitted.

Figure 56:
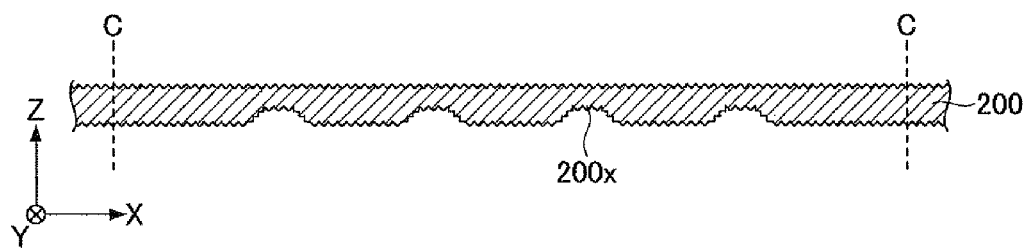
FIG. 56 is a cross-sectional view of a light-emitting element mounting package of a sixth embodiment.

FIG. 56 illustrates manufacturing processes of the light emitting element mounting package of the sixth embodiment. In the method of manufacturing the light-emitting element mounting package of the first embodiment, the process illustrated in FIG. 56 may be added between the process illustrated in FIG. 12 and the process illustrated in FIG. 13. In the process illustrated in FIG. 56, the surface of the metallic foil 200 including the inner walls of the grooves 200x is roughened. The roughening can be performed by etching, oxidation, etching or the like.

As described, by roughening the surface of the metallic foil 200 including the inner walls of the grooves 200x, contact between the metallic foil 200 and the insulating layer 30 can be improved. Further, contact between the wiring portions 41 to 45 which are made of the metallic foil 200 and the reflective film 60 can be improved.

Figure 57:
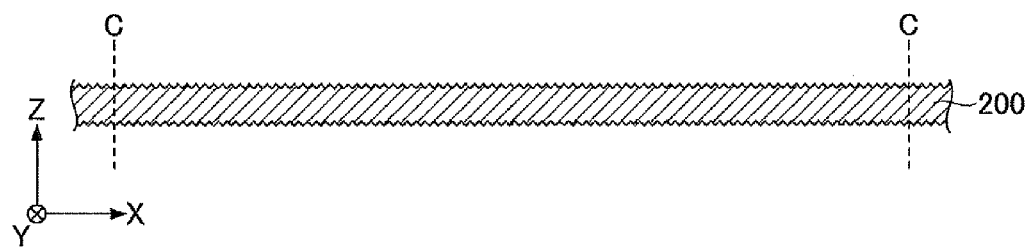
FIG. 57 illustrates a process of manufacturing the light-emitting element mounting package of the sixth embodiment.

In the method of manufacturing the light-emitting element mounting package of the first embodiment, instead of adding the process illustrated in FIG. 56 between the process illustrated in FIG. 12 and the process illustrated in FIG. 13, the process illustrated in FIG. 57 may be added between the processes illustrated in FIGS. 7 and 8.

Figure 58:
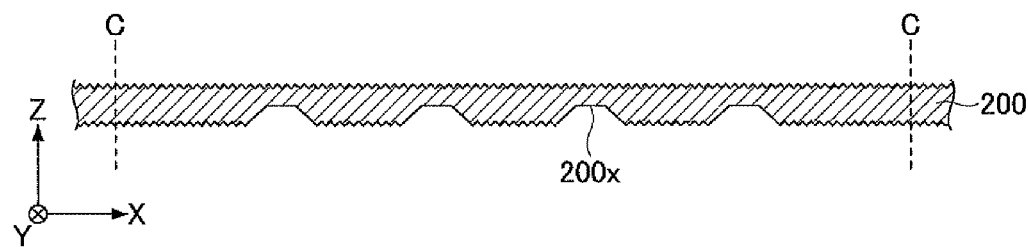
FIG. 58 further illustrates the process of manufacturing the light-emitting element mounting package of the sixth embodiment.

In the process illustrated in FIG. 57, the surface of the metallic foil 200 before forming grooves 200x is roughened. Thereafter, by performing processes similar to those illustrated in FIGS. 8 to 12, a metallic foil 200 illustrated in FIG. 58 is formed instead of the metallic foil 200 (see FIG. 12). In the metallic foil 200 illustrated in FIG. 58, the surfaces of the metallic foil 200 other than the inner walls of the grooves 200x are roughened.

As described, in a case where the surfaces of the metallic foil 200 other than the inner walls of the grooves 200x are roughened, contact between the metallic foil 200 other than the inner walls of the grooves 200x and the insulating layer 30 can be improved. Further, contact between the wiring portions 41 to 45 which are made of the metallic foil 200 and the reflective film 60 can be improved.

Further, the method of manufacturing the light-emitting element mounting package of the sixth embodiment can be applied to the method of manufacturing the light-emitting element mounting package 10B of the fifth embodiment.

For example, light-emitting elements may be mounted on the light-emitting element mounting package of the second, third or fourth embodiment to realize a light-emitting element package.

Further, the processes corresponding to FIGS. 22 to 24 of the first embodiment may be applied to the processes of the second or third embodiment.

Meanwhile, the light-emitting element mounting package may have a simple structure on which only one light-emitting element can be installed.

Meanwhile, a light-emitting element such as a LED may be connected to the light-emitting element mounting packages by wire bonding to obtain a light-emitting element package. Further, a light-emitting element submount such as a LED submount may be connected to the light-emitting element mounting package by flip-chip bonding or wire bonding to obtain a light-emitting element package.

According to the embodiments, a package for mounting a light-emitting element, which has an excellent heat radiation property and into which a light emitting element having a narrow pitch can be easily fit, a light-emitting element package in which plural light-emitting elements are mounted on the package for mounting the light-emitting element, and a method of manufacturing these are provided.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A light-emitting element mounting package comprising:
    a metallic plate;
    an insulating layer that is laminated on the metallic plate;
    a plurality of wiring portions that are laminated on the insulating layer; and
    a reflective film that is formed on the insulating layer and the wiring portions
    wherein the plurality of wiring portions are arranged interposing a predetermined gap between the wiring portions adjacent each other,
    wherein a light-emitting element mounting area is formed on partial areas of upper surfaces of a pair of adjacent wiring portions included in the plurality of wiring portions and is covered with a plating film,
    wherein a part of an upper surface of the light-emitting element mounting area is exposed on the insulating layer,
    wherein cutout portions are formed on lower sides of side edges of the wiring portions and are embedded in the insulating layer and are covered with the insulating layer, and parts of the wiring portions positioned above the cutout portions of the wiring portions are exposed on the insulating layer,
    wherein the reflective film has opening portions through which a part of the light-emitting element mounting area is exposed.

2. The light-emitting element mounting package according to claim 1,
    wherein the cutout portions are formed on the lower sides of some of the side edges which face each other and on the lower sides of other of the side edges which do not face each other.

3. The light-emitting element mounting package according to claim 1,
    wherein a thickness of a part of each wiring portion where the corresponding cutout portion is formed is less than a thickness of another part of each wiring portion where the corresponding cutout portion is not formed.

4. The light-emitting element mounting package according to claim 1,
    wherein a cross-sectional shape of one of the cutout portions and a cross-sectional shape of another of the cutout portions which faces the one of the cutout portions are line-symmetric with respect to an imaginary line passing in a thickness direction of the corresponding wiring portions through a center of the gap between the corresponding wiring portions.

5. The light-emitting element mounting package according to claim 1,
    wherein the plurality of wiring portions are shaped like a rectangular in their plan views, and arranged while interposing the predetermined gap between long sides of the plurality of wiring portions.

6. The light-emitting element mounting package according to claim 5,
    wherein the cutout portions are formed on lower sides of ends in longitudinal directions of the wiring portions.

7. The light-emitting element mounting package according to claim 1,
    wherein the reflective film is formed to cover a part of the insulating film that is exposed between the pair of adjacent wiring portions included in the plurality of wiring portions, and cover the pair of adjacent wiring portions in a vicinity of the part of the insulating film and the plating film in the vicinity of the part of the insulating film.

8. The light-emitting element mounting package according to claim 1,
    wherein thicknesses of the wiring portions are 20 µm to 100 µm, and gaps between the wiring portions which face each other are 50 µm to 100 µm.

9. The light-emitting element mounting package according to claim 1,
    wherein a number of the light-emitting element mounting areas is plural.

10. The light-emitting element mounting package according to claim 1,
    wherein the upper surfaces and lower surfaces of the wiring portions are roughened.

11. The light-emitting element mounting package according to claim 10,
    wherein upper surfaces of the cutout portions are roughened.

12. A light-emitting element package according to claim 1, comprising:
    the light-emitting element mounting package according to claim 1; and
    a light emitting element mounted on the light-emitting element mounting area.

* * * * *